United States Patent
Zimmer et al.

(10) Patent No.: US 9,618,589 B2
(45) Date of Patent: Apr. 11, 2017

(54) FIRST AND SECOND MAGNETO-RESISTIVE SENSORS FORMED BY FIRST AND SECOND SECTIONS OF A LAYER STACK

(71) Applicant: Infineon Technologies AG, Neubiberg (DE)

(72) Inventors: Juergen Zimmer, Neubiberg (DE); Harald Witschnig, Landskron (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/057,214

(22) Filed: Oct. 18, 2013

(65) Prior Publication Data

US 2015/0108972 A1   Apr. 23, 2015

(51) Int. Cl.
G11B 5/39 (2006.01)
G01R 33/09 (2006.01)
H01L 43/12 (2006.01)
H01L 27/22 (2006.01)

(52) U.S. Cl.
CPC .......... *G01R 33/093* (2013.01); *G11B 5/3903* (2013.01); *G11B 5/3909* (2013.01); *G11B 5/3948* (2013.01); *G11B 5/3961* (2013.01); *H01L 27/22* (2013.01); *H01L 43/12* (2013.01)

(58) Field of Classification Search
CPC ............................ G11B 5/3903; G11B 5/3961
USPC ........ 360/314, 315, 316, 324, 324.1, 324.11, 360/324.12, 324.2, 327, 121
See application file for complete search history.

(56) References Cited

U.S. PATENT DOCUMENTS

| | | | |
|---|---|---|---|
| 6,999,285 B2 * | 2/2006 | Gill | G11B 5/3903 360/314 |
| 7,463,459 B2 | 12/2008 | Ding et al. | |
| 7,813,088 B2 | 10/2010 | Tsunekawa et al. | |
| 7,842,334 B2 * | 11/2010 | Wakui | B82Y 25/00 360/314 |
| 7,929,259 B2 | 4/2011 | Gao et al. | |
| 8,242,776 B2 | 8/2012 | Mather et al. | |
| 8,647,891 B2 | 2/2014 | Sun et al. | |

(Continued)

FOREIGN PATENT DOCUMENTS

DE   10140710 A1   1/2003

OTHER PUBLICATIONS

Application and File History for U.S. Appl. No. 13/833,852, filed Mar. 15, 2013 inventors Rasbornig et al.as available on PAIR at www.uspto.gov.

(Continued)

*Primary Examiner* — Jefferson Evans
(74) *Attorney, Agent, or Firm* — Eschweiler & Potashnik, LLC

(57) ABSTRACT

Embodiments relate to a sensor device including a layer stack 600, the layer stack 600 including at least ferromagnetic and non-magnetic layers formed on a common substrate 620. The sensor device 600 further includes at least a first magneto-resistive sensor element 711 provided by a first section 611 of the layer stack 600. The first magneto-resistive sensor element 711 herein is configured to generate a first signal. The sensor device 600 also includes a second magneto-resistive sensor element 712 provided by a second section 612 of the layer stack 610. The second magneto-resistive sensor element 712 herein is configured to generate a second signal for verifying the first signal.

16 Claims, 15 Drawing Sheets

(56) References Cited

U.S. PATENT DOCUMENTS

| | | | |
|---|---|---|---|
| 8,884,616 B2 | 11/2014 | Zimmer et al. | |
| 2008/0291566 A1* | 11/2008 | Biskeborn et al. | 360/75 |
| 2009/0279212 A1* | 11/2009 | Engel | B82Y 25/00 |
| | | | 360/314 |
| 2009/0316309 A1* | 12/2009 | Partee et al. | 360/324.2 |
| 2010/0097088 A1 | 4/2010 | Uemura | |
| 2011/0031965 A1 | 2/2011 | Saruki | |
| 2011/0069413 A1* | 3/2011 | Maat et al. | 360/234.3 |
| 2012/0016623 A1 | 1/2012 | Hayner | |
| 2012/0074972 A1 | 3/2012 | Rasbornig et al. | |
| 2012/0126806 A1 | 5/2012 | Zimmer | |
| 2012/0249170 A1 | 10/2012 | Baumann | |
| 2012/0262152 A1 | 10/2012 | Ausserlechner | |
| 2012/0262196 A1 | 10/2012 | Yokou | |
| 2013/0049780 A1 | 2/2013 | Collins | |
| 2013/0076383 A1 | 3/2013 | Poinstingl | |
| 2013/0200909 A1 | 8/2013 | Rasbornig et al. | |
| 2013/0286511 A1* | 10/2013 | Edelman et al. | 360/234.3 |
| 2013/0314075 A1 | 11/2013 | Ausserlechner et al. | |
| 2014/0063644 A1* | 3/2014 | Lou | G11B 5/4886 |
| | | | 360/75 |

OTHER PUBLICATIONS

Application and File History for U.S. Appl. No. 12/889,749, filed Sep. 24, 2010 inventors Rasbornig et al. as available on PAIR at www.uspto.gov.

* cited by examiner

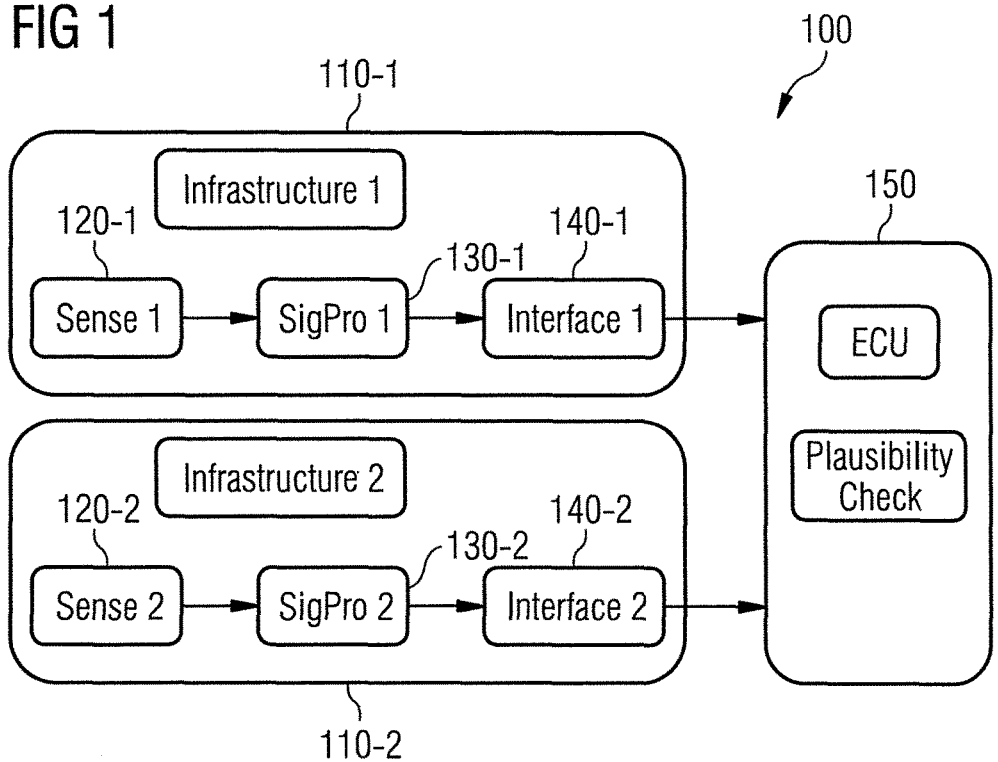
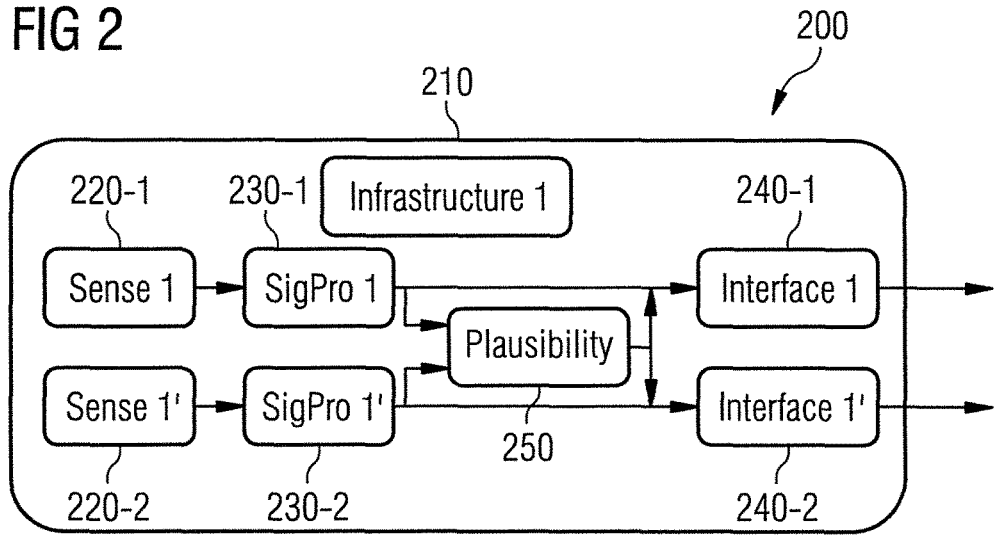

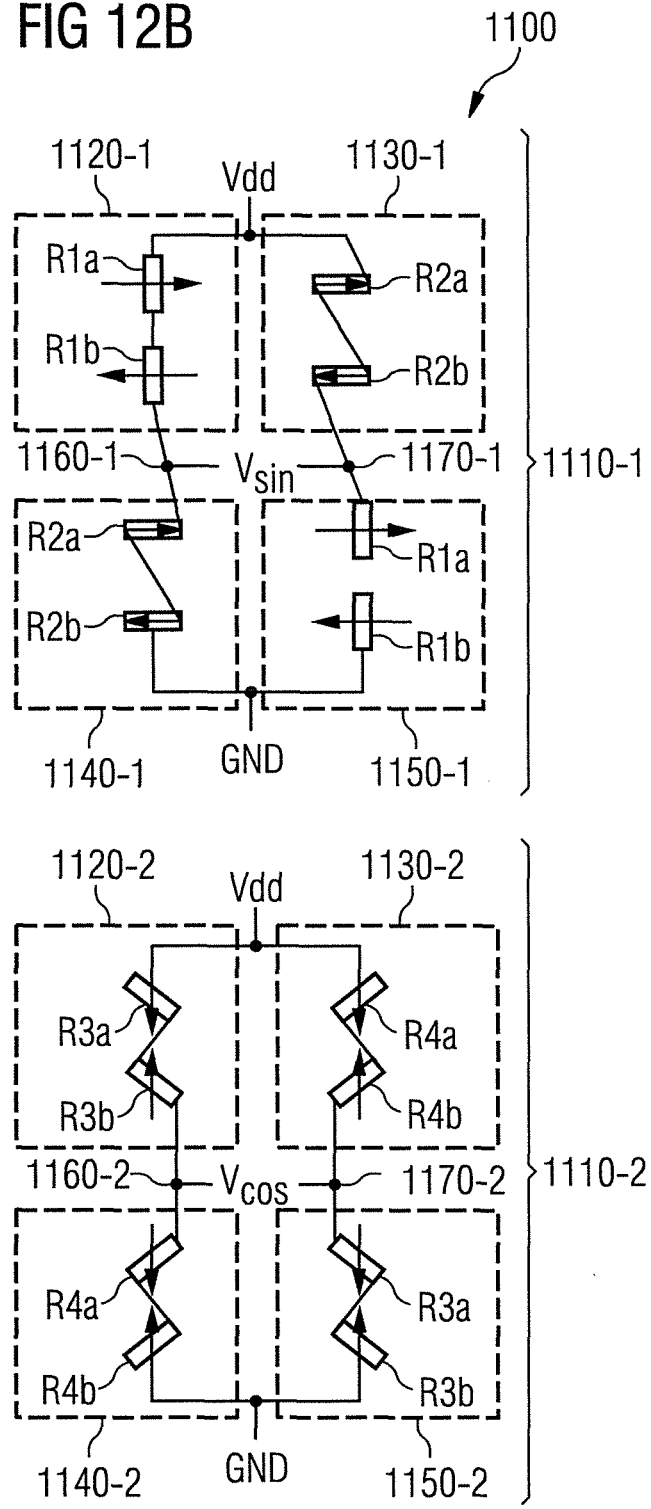

FIRST AND SECOND MAGNETO-RESISTIVE SENSORS FORMED BY FIRST AND SECOND SECTIONS OF A LAYER STACK

TECHNICAL FIELD

Embodiments relate to sensor devices, or more specifically to sensor devices comprising magneto-resistive sensor elements.

BACKGROUND

Magneto-resistive effects include a number of different physical phenomena, all of which having in common that an electrical resistance of a resistive element is alterable by the behavior of a magnetic field penetrating the resistive element. Technologies utilizing magneto-resistive effects are sometimes referred to as "XMR technologies", whereby the X indicates that a multitude of effects may be addressed here.

One example is the Anisotropic Magneto-Resistive (AMR) effect, which is based on the fact that in a (nanometer-) thin conductive layer the electrical resistance may be changed by altering an angle between an external magnetic field and a direction of an electric current within the layer plane. The effect may be explained by a distortion of atomic orbitals due to spin orientation in a magnetic field and hence different scattering cross sections of conducting electrons.

Another example is the Giant Magneto-Resistive (GMR) effect, which may occur in a layer stack of layers comprising at least two ferromagnetic layers separated by a non-ferromagnetic layer. If both ferromagnetic layers are magnetized the electrical resistance of the layer stack may be altered by changing the angle between the magnetization directions of the ferromagnetic layers, whereby the effect results from electron scattering depending on spin orientation of the electrons. The different magnetization directions may be achieved by pinning one ferromagnetic layer (pinned layer) to a reference magnetization, whereas the magnetization of the other ferromagnetic layer (free layer) may depend on an external magnetic field.

Yet another example is the Tunnel Magneto-Resistive (TMR) effect, which may occur in a layer stack of (nanometer-) thin layers comprising at least two ferromagnetic layers separated by an electrically isolating layer. If both ferromagnetic layers are magnetized the electrical resistance of the layer stack may be altered by changing the angle between the magnetization directions of the ferromagnetic layers, whereby the effect results from tunneling probability depending on the orientations of electron spin and of the magnetic fields. Again, the different magnetization directions may be achieved by pinning one ferromagnetic layer (pinned layer) to a reference magnetization, whereas the magnetization of the other ferromagnetic layer (free layer) may depend on an external magnetic field.

XMR effects may be applied in a variety of field based sensors, for example for measuring revolution, angles, etc. In some applications, especially in applications relevant to safety, it is required that these sensors operate reliably and at a high level of accuracy. Conventional solutions comprise redundancy concepts featuring two independently manufactured sensors, which are expensive in terms of production effort and cost. Conventional solutions further comprise safety algorithms that have only limited capability, resulting in unrecognized errors. As a result, the price for a XMR sensor significantly increases with its functional safety features.

It is hence desirable to improve a compromise between reliability, accuracy, production effort and cost of XMR sensors.

SUMMARY

According to one aspect, it is provided a method for manufacturing or providing a sensor device. The method comprises forming a layer stack. The layer stack comprises ferromagnetic and non-magnetic layers on a common substrate. The method further includes separating the layer stack into a first section and a second section. Therein, a first magneto-resistive sensor element is formed by the first section of the layer stack and a second magneto-resistive sensor element is formed by the second section of the layer stack.

One or more embodiments are further related to a sensor device. The sensor device comprises a layer stack which includes at least ferromagnetic and non-magnetic layers formed on a common substrate. The sensor device further comprises at least a first magneto-resistive sensor element provided by a first section of the layer stack. The first magneto-resistive sensor element herein is configured to generate a first signal. The sensor device also comprises at least a second magneto-resistive sensor element provided by a second section of the layer stack. The second magneto-resistive sensor element herein is configured to generate a second signal for verifying the first signal.

According to yet a further aspect, embodiments refer to a sensor device which comprises a master magneto-resistive sensor element for providing a master sensor signal with a first measurement accuracy. The sensor device also includes an auxiliary magneto-resistive sensor element for providing a verification signal with a second measurement accuracy to verify the master sensor signal. Therein the first measurement accuracy is higher than the second measurement accuracy.

Moreover, some embodiments refer to a method for operating a magneto-resistive sensor comprising a layer stack. The layer stack comprises ferromagnetic and non-magnetic layers commonly formed on a common substrate. The method includes generating a first signal indicative of a condition of a magnetic field by means of a first magneto-resistive sensor element integrated into the layer stack. The method further comprises generating a second signal indicative of the condition of the magnetic field by means of a second magneto-resistive sensor element integrated into the layer stack. In addition, the method comprises verifying the first signal by means of the second signal.

BRIEF DESCRIPTION OF THE FIGURES

Some embodiments of apparatuses and/or methods will be described in the following by way of example only, and with reference to the accompanying figures, in which FIG. 1 depicts a flow chart illustrating a conventional architecture featuring two fully independent sensors;

FIG. 2 depicts a block diagram illustrating a conventional architecture featuring a redundancy concept;

FIG. 12b depicts a schematic view of a circuit arrangement for AMR sensors comprised by a sensor device;

DESCRIPTION OF EMBODIMENTS

Figure 3A:
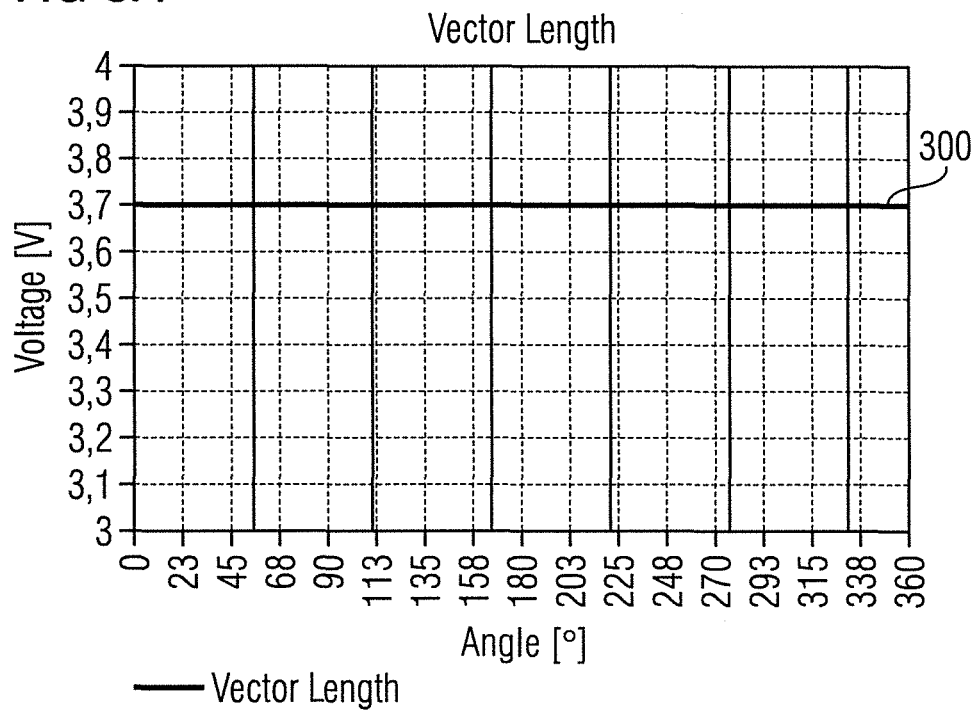
FIG. 3a depicts a diagram showing an evaluation of a vector length according to a conventional solution.

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Functional Safety may represent a clear differentiator for current and future products, for example in Automotive. To achieve corresponding targets in terms of Automotive Safety Integrity Level (ASIL) new and enhanced concepts have to be established. To achieve a dedicated ASIL level different target parameters such as Failures In Time (FIT) rate, Diagnostic Coverage (DC), Single Point Fold Matrix (SPFM), Latent Point Fold Matrix (LPFM), etc. have to achieve a dedicated value. Such a value may be for example 90 per cent, indicating a probability of 90% that a given error is recognized as such. DC, SPFM and LPFM each yield a value given in per cent, whereby the respective methods of calculation differ from each other. A key element to achieve these values may be "intelligent" redundancy and diversity.

The problem of achieving ASIL-related targets may be solved conventionally by providing fully independent sensors. Such sensors are comprised by separate integrated circuits and/or which have been manufactured independently from each other. This architecture may allow fulfilling the expected target values (e.g. diagnostic coverage of more than 90%) but it may represent an expensive scenario to achieve this goal. FIG. 1 depicts a flow chart illustrating a conventional sensor or measurement architecture 100 featuring two fully independent sensors. Each separate Integrated Circuit (IC) 110-1, 110-2, comprises a sensor 120-1, 120-2 to detect a measurement value and in response cause a signal, a processing means 130-1, 130-2 to process the signal, wherein the processing means 130-1, 130-2 may for example be an Analog-to-Digital Converter (ADC) or an amplifier, and an interface 140-1, 140-2 to provide the processed signal to an Electronic Control Unit (ECU) 150. The conventional sensor or measurement architecture 100 exhibits two separate integrated circuits 110-1, 110-2 which may have been produced or manufactured completely independently from each other.

The processed signals may be received by the ECU 150, which may perform a plausibility check. The plausibility check may for example comprise a comparison of the processed signals or an evaluation if a ratio between the two signals is within a previously given range of values. However, a setup of two separate infrastructures may be costly and require substantial production effort. The conventional architecture 100 may further use up a large portion of available installation space, which might for example be problematic in terms of electromagnetic compatibility when employed in an automobile or vehicle, where large amounts of electronic components are packed in a comparatively small volume. In other words, a pure doubling of circuit blocks may represent a possibility that may lead to significant cost enhancements and may therefore not be suitable or efficient.

Moreover, redundancy may be introduced within a single IC. FIG. 2 introduces a sensor architecture 200 according to a conventional approach, which may help to achieve the aforementioned target parameters (e.g. FIT rate, DC, etc.) by introducing (intelligent) redundancy in a single IC infrastructure 210, and taking into account two independent sense elements on the IC 210. "Independent" may be understood as having been manufactured independently from each other. The IC 210 comprises a first sensor 220-1 and a second sensor 220-2 for detecting first and second measurement values and, in response, causing first and second signals, respectively. The first and second signals may be processed by a first processor 230-1 and a second processor 230-2 comprised by the IC 210, respectively, and thereafter be checked in terms of plausibility by an integrated control unit 250. The control unit 250 may give a feedback on whether or not the first and the second signal correspond to each other may be safely forwarded by a first interface 240-1 and a second interface 240-2, respectively. However, the setup of FIG. 2 may conventionally require manufacturing of two sense elements 220-1, 220-2 in two separate steps and hence additional effort and costs. Moreover, due to differences in their respective production processes and utilized materials, two separately provided sense elements 220-1, 220-2 may respond differently to a physical quantity to be measured, which may give rise to additional errors.

Furthermore, another signal processing and safety mechanisms may be introduced. Dedicated Safety mechanisms may aim to detect deviations from an expected sensor signal that might result from different kinds of errors in the analog or digital part of the IC. Another conventional example to identify deviations from a real angle value might be a vector length check. Assuming an angle value, which, in case of a usage of GMR sensors, may be given by a cosine signal X and a sine signal Y, the signals X and Y ideally (in other words, in the absence of errors) fulfill the Equation of the Circle $X^2+Y^2=A^2$ for every angle in a 0°-360° range. The value A is a radius of a circle, the radius corresponding to a maximum possible amplitude of X and Y, and its absolute value representing the length of the vector to be checked. Calculation of a vector length may be done by adding squares of the first and the second signal values, respectively, and extracting the square root of the sum.

FIG. 3a shows an evaluation of the vector length A according to a conventional solution, where the calculated vector length A is expressed in terms of a voltage, as the signals X and Y are conventionally measured in Volts (V). The voltage in V is shown on the y-axis, and a measured angle in degrees)(° is shown on the x-axis. Ideally, the vector length A is a constant function 300 in terms of the measured angle, as can be seen from FIG. 3a. Errors in the IC may lead to an offset in the X or Y signals, and therefore to a deviation of A from this constant value. This may indicate a deviation in terms of angle.

Figure 3B:
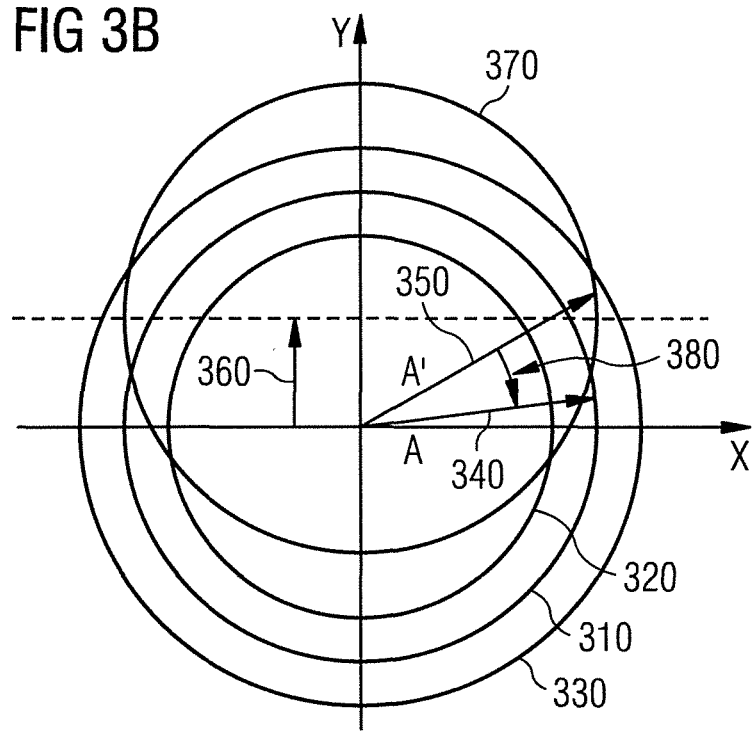
FIG. 3b depicts a graphic showing an evaluation of a vector length according to a conventional solution.

FIG. 3b visualizes the aforementioned vector length check. Ideally, the two sinusoidal signals X and Y are phase-shifted to each other by 90° and hence the sum of the square of their values for a given angle corresponds to a square of a vector length. In other words, X and Y ideally are in a mutual relationship for all angles, which fulfills the Equation of the Circle $X^2+Y^2=A^2$, where A is the radius of the circle.

FIG. 3b shows a Cartesian grid with an X-axis and a Y-axis, where a central circle 310 displays the ideal case of error-free signals X and Y over a 360° range. An inner circle 320 and an outer circle 330 mark the limits for the vector length, within which the signals X and Y are not recognized as erroneous. An exemplary vector 340 with length A calculated from two error-free signals X and Y is shown in FIG. 3b.

A further vector 350 is shown to represent a situation in which the X signal is kept, but the Y signal is subject to an offset 360. The offset 360 in Y may be described mathematically by a shift parameter in the Equation of the Circle, which, for the new possible values of Y, results in an eccentric circle 370. Accordingly, the further vector 350 for the X and Y signals may, for some angular values, lie within the vector length limits, or outside for other angular values. In FIG. 3b, although the further vector 350 exhibits a length A' which is still within the allowed boundaries, the vector 340 and the further vector 350 are pointing into different directions. This difference in directions can be indicated by an error angle 380, by which a measured angle value calculated from faulty X or Y signals may deviate from an actual angle value. In other words, the detection range of offset errors may correspond to the section of the eccentric circle 370 lying outside the limits for the vector length (circles 320 and 330), if the detection is performed by a minimum/maximum vector length check.

As explained in FIGS. 3a and 3b, errors in the IC may lead to a deviation of this constant value and may therefore represent an indication for a deviation in terms of angle. Nevertheless the capabilities of these signal processing mechanisms may not be fully given for every application scenario. To detect deviations with high probability, e.g. at least 90%, a rotation of the magnet/application may be necessary, because regions may exist where the vector length is within predefined limits, but the angle error is already larger than allowed. This case is exemplified in FIG. 3b, where a rotation may be necessary to recognize the further vector 350, and hence the signals X or Y as erroneous. In many situations, however, the rotation of the magnet/application may not be feasible.

Figure 4:
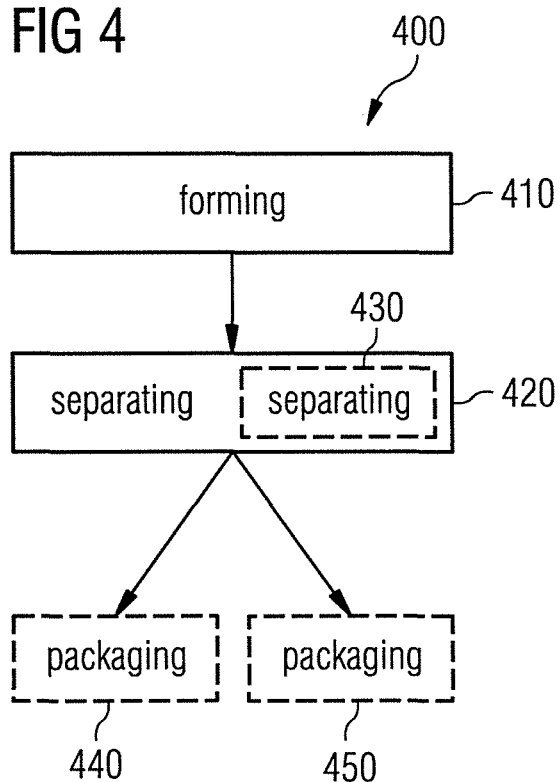
FIG. 4 depicts a flow chart illustrating a method for providing a magneto-resistive sensor according to an embodiment.

For sensor devices such as angle sensors, for example, a typical safety goal may be to guarantee a defined angle accuracy value in a predefined time, e.g. 5° deviation of a true angle value has to be detected in 5 milliseconds (ms). A problem to be overcome in that context may simply be how to guarantee validity of a detected value by avoiding usage of a second independently manufactured sense element. Turning now to FIG. 4, an embodiment of a schematic flow-chart of a manufacturing method 400 for a sensor device is shown.

The method 400 comprises a forming, of a layer stack comprising at least ferromagnetic and non-magnetic layers on a common substrate, see 410. The method 400 further comprises a separating of the layer stack into a first section and a second section, see 420. A first magneto-resistive sensor element may be formed by the first section of the layer stack and a second magneto-resistive sensor element may be formed by the second section of the layer stack. Manufacturing of at least two XMR sensor elements may thus be performed in one common production process using the same layer stack. Forming at least two XMR sensor elements from a common layer stack may reduce possible sources of errors during employment, as the two XMR sensor elements may exhibit a more similar behavior during operation compared with two XMR sensor elements formed from different layer stacks. Functional safety may thus be further increased.

The method 400 comprises a forming, of a layer stack comprising at least ferromagnetic and non-magnetic layers on a common substrate, see 410. The method 400 further comprises a separating of the layer stack into a first section and a second section, see 420. A first magneto-resistive sensor element may be formed by the first section of the layer stack and a second magneto-resistive sensor element may be formed by the second section of the layer stack. Manufacturing of at least two XMR sensor elements may thus be performed in one common production process using the same layer stack. Forming at least two XMR sensor elements from a common layer stack may reduce possible sources of errors during employment, as the two XMR sensor elements may exhibit a more similar behavior during operation compared with two XMR sensor elements formed from different layer stacks. Functional safety may thus be further increased.

In one or more embodiments forming the layer stack may for example be done by epitaxy. Separating the layer stack may for example be done by diverse etching processes like Ion Beam Etching (IBE), reactive ion beam etching or wet etching. Furthermore, separating the layer stack may be achieved through lift-off processes.

In some embodiments, as shown in FIG. 4, separating 420 the layer stack may comprise separating 430 the common substrate comprising the first and the second section into a first and a second die. The first die may comprise the first section, and the second die, correspondingly, may comprise the second section. Multiple sensor elements may thus be mounted independently into one or more sensor devices while still being formed in a common manufacturing process, which may increase measurement reliability and/or production efficiency.

A die may be a small block of semiconducting material on which a given functional circuit may be fabricated. Integrated circuits may be produced in large batches on a single wafer. The wafer may be cut ("diced") into many pieces, each containing one copy of the circuit. Each of these pieces may be referred to as a die. The wafer, which may be referred also as slice or substrate, may for example comprise materials like electronic-grade silicon (EGS) or other semi-conductors (such as GaAs or silicon crystal). The dicing process can for example be accomplished by scribing and breaking, by mechanical or by laser cutting, wherein the layer stack may be separated in the same process.

In one or more embodiments the method 400 may comprise packaging 440 the first die into a first integrated circuit package. The method 400 may also comprise packaging 450 the second die into a second integrated circuit package. Integrated circuit packaging may be one of the final stages during the process of semiconductor device fabrication, and may be preceded by die preparation, where a wafer is broken into individual dies. In the stage of IC packaging a block of semiconducting material, for example a die, is encased in a supporting case. The case may prevent physical damage and corrosion, and is known as a "package." It may also support the electrical contacts which for example connect the device to a circuit board.

The first and the second die may be packaged into separate IC packages in some embodiments. In other embodiments, they may also be packaged into a common Multi Chip Package (MCP). An MCP is an electronic package where multiple ICs, semiconductor dies or other discrete components are packaged onto a unifying substrate. The multiple dies may externally act as one chip and be employed as such.

Figure 5:
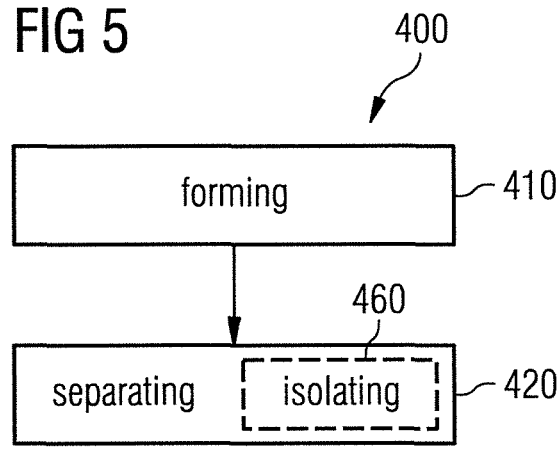
FIG. 5 depicts a flow chart illustrating another method for providing a magneto-resistive sensor according to an embodiment.

In some embodiments, the first and second section of the layer stack may not be fully separated into two different dies. Instead, both sections may still be left on the common substrate. In such embodiments, separating 420 the layer stack may comprise an alternative step of electrically isolating 460 the first and the second magneto-resistive sensor element on the common substrate forming a common die. A flow-chart of a corresponding method 400 is illustrated in FIG. 5. It may therefore be possible to realize several sensors or sensor elements in a common process and on a common substrate, possibly reducing costs, installation space, or production effort.

In the following examples will be explained, in which the at least two stack sections are left on the common substrate. In embodiments at least two XMR sensor elements (formed by the at least two stack sections) sharing the same original layer stack may be realized on the common substrate.

Figure 6:
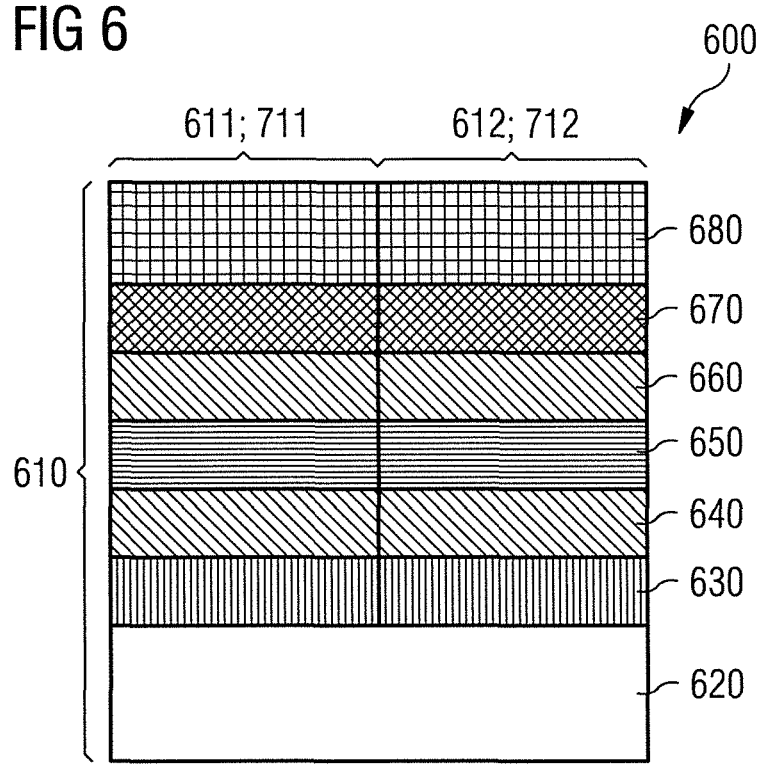
FIG. 6 illustrates an embodiment of a layer stack usable for a GMR sensor.

FIG. 6 shows an embodiment of a layer stack 610 which is usable, for example, for a GMR sensor comprised by a sensor device 600.

The sensor device 600 comprises an exemplary layer stack 610 including possibly alternating ferromagnetic and non-magnetic layers formed on a common substrate 620. Non-magnetic in the following context may be understood as non-ferromagnetic in specific. Non-magnetic layers may therefore still comprise diamagnetic or paramagnetic layers. The substrate 620 may comprise any means capable of bearing the layer stack 610; in specific, the substrate 620 may for example be a silicon wafer. The layers comprised by the layer stack 610 may for instance be applied to the substrate 620 by an epitaxial method.

The substrate 620 may be regarded as being a layer of the layer stack 610. Further, the exemplary layer stack 610 comprises an optional buffer layer 630, a first ferromagnetic layer 640 or free layer (FL) 640, an electrically conductive non-magnetic layer 650, a second ferromagnetic layer 660 or pinned layer 660, a natural anti-ferromagnetic layer 670 and an optional cover layer 680 in said order. Alternatively, the natural anti-ferromagnetic layer 670 may in some embodiments be located between the substrate 620 and the first ferromagnetic layer 640, effectively causing the first ferromagnetic layer 640 and the second ferromagnetic layer 660 to switch roles; in other words, the first layer 640 may become the pinned layer and the second ferromagnetic layer 660 may become the free layer.

The ferromagnetic layers 640, 660 may comprise iron, cobalt or nickel. The ferromagnetic layers 640, 660 may be made from alloys of these among others, like e.g. permalloy. The non-magnetic layer 650 may comprise any non-magnetic, electrically conductive material, for example copper, ruthenium or chrome. In some embodiments, for example relating to TMR sensors, the non-magnetic layer 650 may comprise electrically isolating material.

The natural anti-ferromagnetic layer 670 in FIG. 6 may pin down a magnetization direction of the neighboring ferromagnetic layer 660 by the so-called exchange bias interaction. Thus, in some embodiments, the neighboring ferromagnetic layer 660 may become the pinned layer 660. An external magnetic field may be applied to the layer stack 610, which may influence a magnetization direction of the free layer 640. The external magnetic field may be a magnetic field originating externally to the layer stack 610, and at least partially pass through the layer stack 610. The condition of the magnetic field may include an orientation with respect to a magnetization of the pinned layer 660 or a field strength.

The external magnetic field may include a rotating magnetic field for example to sense a rotation of a gear wheel or encoder. The magnetization of the free layer 640 may rotate freely corresponding to the rotating magnetic field. An electric current may be applied to the non-magnetic layer 650. Depending on an alignment of the magnetization of the free layer 640 with respect to the magnetization of the pinned layer 660, an electric resistance may be altered. For GMR or TMR sensors, resistance may be highest when said magnetizations of the pinned and free layers are in anti-parallel alignment and lowest when in parallel alignment.

In embodiments, the sensor device 600 comprises at least a first magneto-resistive sensor element 711 provided by a first section or portion 611 of the layer stack 610. The first magneto-resistive sensor element 711 is configured to generate a first electrical signal. The sensor device 600 also comprises a second magneto-resistive sensor element 712 provided by a second section or portion 612 of the same layer stack 610. The second magneto-resistive sensor element 712 is configured to generate a second electrical signal for verifying the first electrical signal. The first and second signals may be an electric voltage or an electric current signal. The first and second signals may be continuous, discrete, or a combination thereof. The first and second signals may be analog or digital signals.

Figure 6A:
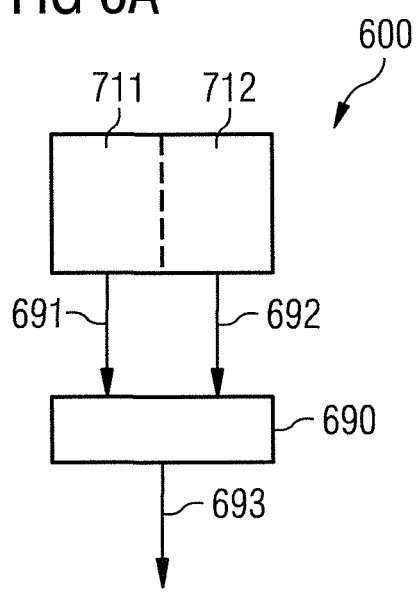
FIG. 6a shows a block diagram of a sensor device with a means for verification of a first signal by a second signal.

FIG. 6a shows a simplified embodiment of a sensor device 600 with a means for verification 690 of the first signal 691. The means for verification 69 may e.g. be a circuit, a processor or other electric or electronic component. The first magneto-resistive sensor element 711 provides the first signal 691 to the means for verification 690, and the second magneto-resistive sensor element 711 provides the second signal 692 to the means for verification 690. The means for verification 690 may be configured to compare the first signal 691 against the second signal 692, for example by producing a differential signal from the first signal 691 and the second signal 692. If the differential signal exceeds a predefined limit, the means for verification 690 may in some embodiments be configured to providing a warning signal 693. The warning signals 693 may in further embodiments comprise instructive information for a shutdown of the sensor device 600.

An integration of two or even more sensor elements on the same substrate using the same layer stack may allow achieving enhanced safety goals. It may be possible to combine two different XMR technologies on the common substrate. At the same time it may represent a tradeoff between redundancy, costs and achievable safety measures.

As has been described with reference to FIGS. 4 and 5, the magneto-resistive sensor elements 711, 712 may be produced in one common process 400. In FIG. 6 the sections 611; 612 providing the magneto-resistive sensor elements 711; 712 are exemplarily arranged side by side with respect to a surface of the substrate 620. Layers forming the first section 611 may at least partially share a plane with layers forming the second section 612. These layers may be superposed in other embodiments. For example, in some embodiments, the layers forming the first section 611 are not sharing a common plane with the layers forming the second section 612 and the sections 611; 612 are situated on top of each other.

In embodiments, sections of the layer stack may form sensor elements, such as GMR sensor elements, magneto-resistive sensor element, etc. For instance, the first section 611 may also be described as "sensor element 711," and the second section 612 may be described as "sensor element 712."

In some embodiments the first magneto-resistive sensor element 711 and the second magneto-resistive sensor element 712 may be monolithically integrated on a common die. Production costs may be significantly lower with reduced installation space and production efforts. As has been explained before in FIG. 4, the first magneto-resistive sensor element 711 and the second magneto-resistive sensor element 712 may also be produced in a common process 400 but thereafter be mounted on separate dies during the process 400. Production costs and effort may also be reduced in such embodiments in view of the first magneto-resistive sensor element 711 and the second magneto-resistive sensor element 712 being formed on a common substrate. As described above, the layer stack may be separated into a first and a second section, and along with it, the substrate may be separated, for example a silicon wafer may be diced.

It has been mentioned above that the first sensor element 711 and the second sensor element 712 are configured to generate a first and a second signal, respectively. However, it is also possible to arrange a plurality of sensor elements in a measurement bridge in order to generate the respective signal. For instance, the sensor element 711 may be existent four times in order to realize a Wheatstone bridge, comprising all four sensor elements. Keeping this in mind, embodiments address the introduction of a diversified and redundant sensor element, which may be put into practice in two or more exemplary variations. These are described in more detail in the following. On the one hand a simple approach using a second magneto-resistive (XMR) sensor bridge relying on the same magneto-resistive technology as a first XMR sensor bridge may be realized. On the other hand a sophisticated approach where a second sensor bridge based on a different XMR technology may be used while keeping technological complexity low. Said embodiments may allow a sensor device 600 to achieve a high DC and ASIL level.

Figure 7A:
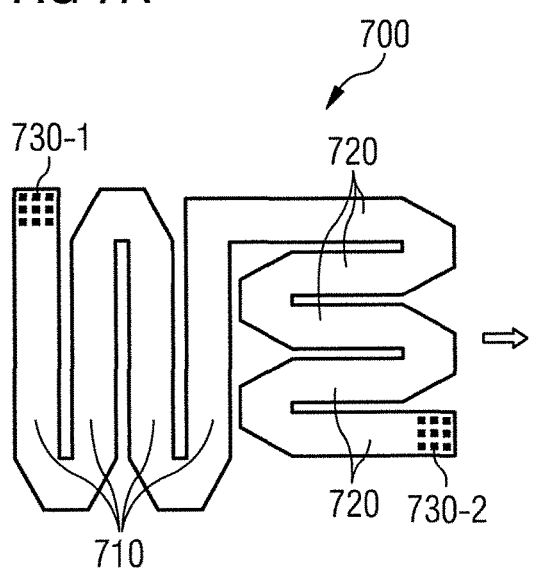
FIG. 7a illustrates a conventional GMR sensor.

A first embodiment may be understood more clearly by reference to FIG. 7a, which shows a top view of a conventional meander layout of a GMR angle sensor 700 with a combination of substantially perpendicular orientations of the stripe axes. The GMR angle sensor 700 has a meandered shape with meander windings 710 and meander windings 720. The orthogonally aligned axes of the meander windings 710 and 720 suppresses parasitic anisotropic magneto-resistive (AMR) effects that may depend on processes within the free layer. The meander is shaped by a single stripe. The stripe width is chosen to inherently exhibit a low magnetic shape anisotropy to achieve a low anisotropy error of the sensor. Magnetic anisotropy is a directional dependence of magnetic properties of a material. A stripe width of >10 µm, e.g. 13 µm, may be selected, which may enable a good compromise between active area size, meander resistance, power consumption and angular accuracy. An upper left and lower right end of the meander shaped GMR angle sensor 700 further comprise conductive contacts 730-1 and 730-2, respectively, which may for example be used for surface mounting purposes like connecting the GMR sensor 700 to a printed circuit board (PCB).

The first embodiment may be referred to as a dual sensor structure approach. For some applications it may be necessary to introduce not only one but at least two Wheatstone bridge circuits comprising XMR sensor elements, for example to implement a double bridge. It may be possible to apply reference magnetizations to XMR sensor elements of one of the two bridge circuits which are orthogonal to reference magnetizations of corresponding XMR sensor elements of the other bridge circuit. In doing so, a unique determination of an orientation angle of an external magnetic field may be enabled. The usage of a second sensor double bridge of the same XMR technology but of a different geometry allows making sensor elements with different behavior such as different angular accuracy or different power consumptions.

For instance, regarding a "length" of a sensor as a dimension parallel to a path between two electric contacts (compare for example the conductive contacts 730-1 and 730-2 in FIG. 7a), and a "width" of the sensor as a dimension perpendicular to a path between two electric contacts, the sensor may exhibit an elongated shape. For example, the length may in some embodiments be at least two, at least five or at least ten times larger than the width. Decreasing the width may therefore lead to a more extreme elongated shape, facilitating perturbations related to anisotropy. With those perturbations being more pronounced, a lower accuracy in measurement may result.

In some embodiments an accuracy of information of the first or second signal may be dependent on a width, or, more globally, on a mean value of the width of the corresponding magneto-resistive sensor element or a magneto-resistive effect utilized by the corresponding magneto-resistive sensor element. The mean value of the width may for example be a median, a geometric or arithmetic mean value. The width is measured in a direction parallel to the main surface of the substrate bearing the layer stack. A reduction of the mean value of the width may decrease the accuracy of a measurement signal. It may be practical to divide a previously manufactured layer stack according to the aforementioned method 400 into a wider XMR sensor element 711 with negligible loss of accuracy and a narrower XMR sensor element 712 with significantly higher but still affordable loss of accuracy. Thus, it may be possible to realize magneto-resistive elements with different power consumptions and different accuracies of their respective signals, wherein a signal with high accuracy may be verified by a signal with comparatively low accuracy. The additional XMR sensor element can be provided to have low power consumption but at the expense of reduced angular accuracy. The reduced angular accuracy may however for verifying applications for functional safety be fully sufficient. Moreover, usage of additional installation space may be avoided, and an active area similar to the conventional single sensor solution may be kept this way.

This first embodiment may provide redundancy to a certain level sufficient for certain applications. The second sensor double bridge may act as an auxiliary sensor and may support the sensor system to verify the angle result of the main ("master") sensor. The auxiliary sensor double bridge might exhibit a (mean) stripe width for example being at least a factor 1.2, 1.5 or 2 narrower that the master sensor and/or only half bridge configurations with reduced signal height to decrease the power consumption.

Figure 7B:
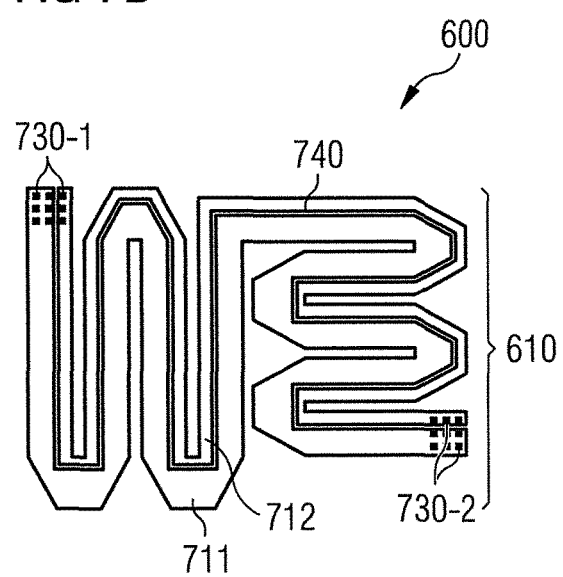
FIG. 7b illustrates an embodiment of two monolithically integrated GMR sensors.

FIG. 7b illustrates an embodiment of two monolithically integrated GMR sensor elements 711; 712. In some embodiments, the first sensor element 711 and the second sensor element 712 are separated from each other in the layer stack by an isolating structure 740. In other words, a single stripe of wide size (for example >10 µm) such as the stripe shown in FIG. 7a forming the structured layer stack 610 may be divided into a broad and a narrow stripe by an isolating structure 740. This may provide an efficient method to generate two sensor elements of different shapes from a single structured stack. The isolating structure 740 may be implemented for example by introducing a groove in-between. A width in this context (e.g. "broad", "wide", etc.) may refer to a dimension of the sensor element measured perpendicular to an edge of the sensor element bordering the isolating means and parallel to the surface of the substrate bearing the layer stack In some embodiments the first magneto-resistive sensor element 711 may differ from the second magneto-resistive sensor element 712 at least in a dimension. The term dimension refers to a physical dimension in this context, or, in other words, spatial extent, e.g. width, length or height. FIG. 7b illustrates an example, where the first sensor element 711 and the second sensor element 712 differ significantly in width.

In order to keep an active area comparable in size to the single sensor configuration shown in FIG. 7a, the wide stripe can be shrunk down, for example from originally 13 µm to 10 µm. The installation space cleared this way may be (partially) consumed by the narrow stripe. In some embodiments a mean value of a width of the second magneto-resistive sensor element 712 may correspond to a mean value of the width of the first magneto-resistive sensor element 711 within a range of maximum 90% of the mean value of the width of the first magneto-resistive sensor element 711. The mean value of the width here is measured perpendicular to a plane separating the first sensor element 711 and the second sensor element 712. Installation space consumed by the sensor device 600 may be reduced this way.

In some embodiments a mean value of a width of the second magneto-resistive sensor element 712 may correspond to 40% to 60% of a mean value of a width of the first magneto-resistive sensor element 711. Installation space may thus be further reduced. FIG. 7b shows a second sensor element 712 having about half the width of the first sensor element 711. For instance, if the first sensor element 711 is 10 µm in width, the second may be 5 µm.

The first sensor element 711 and the second sensor element 712 may comprise an identical number of ferromagnetic and non-magnetic layers in some embodiments. This configuration may be carried out with relatively simple means. FIG. 7b shows the layer stack face-on. Therefore the isolating structure 740 has an orientation perpendicular to a layer plane of one of the layers comprised by the stack 610. Further embodiments may alternatively have an isolating means separating the stack parallel to a layer plane, so the first sensor element 711 and the second sensor element 712 are arranged on top of each other.

In some embodiments the isolating structure 740 may comprise a separator separating the first sensor element 711 and the second sensor element 712 such that the first sensor element 711 and the second sensor element 712 are arranged adjacently on the common substrate 620 in a direction parallel to the common substrate 620. The isolating structure 740 may therein for example be a groove, and the separator may be formed by an isolating material, such as plastics, air or a vacuum. A direction parallel to the common substrate 620 is, in other words, parallel to a surface of the substrate carrying the layer stack 610. By an arrangement of the first sensor elements 711 adjacently to the second sensor element 712 a common magnetization process of the first sensor element 711 and the second sensor element 712 by the same method, for example laser magnetization, may be enabled. Hence, complexity of the sensor device 600 may be reduced.

In FIG. 7b, the first sensor element 711 is directly adjacent to the isolating structure 740, and the isolating structure 740 is directly adjacent to the second sensor element 712. The sensor elements 711; 712 both have an end comprising electric contacts 730-1 and an opposite end comprising electric contacts 730-2, for example for purposes of surface-mounting. The first sensor element 711 and the second sensor element 712 are running parallel to each other; in other words, current paths between the contacts 730-1 and the contacts 730-2 within the first sensor element 711 and the second sensor element 712, respectively, are running parallel to each other. Both sensor elements 711; 712 exhibit a meandered shape. For each sensor element 711, 712, the meandered shape comprises first sections and second sections which are substantially orthogonal to each other, similar to the GMR angle sensor 700 in FIG. 7a.

As explained with respect to FIG. 7b, the width of the first sensor element 711 or second sensor element 712 may have an influence on angular accuracy of an angle value measured by the respective sensor element. Measuring results may be subject to errors like anisotropy error and hysteresis error, which may vary depending on sensor width. Anisotropy error may include an error due to a directional dependence. Hysteresis may occur when exposing a ferromagnetic medium to a magnetic field such that a rest magnetization may remain in the medium.

Figure 8:
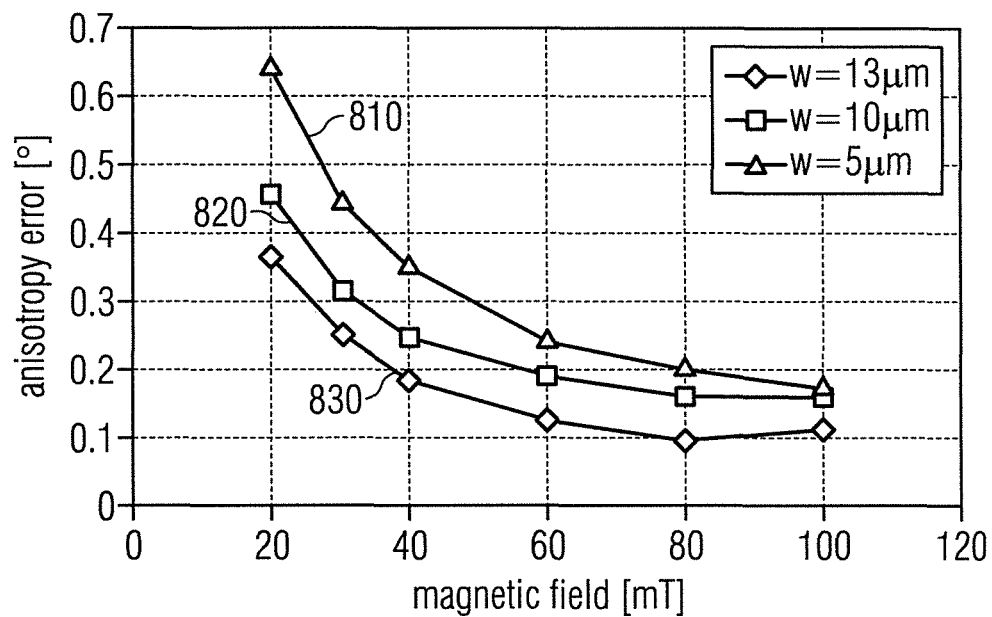
FIG. 8 depicts a diagram showing a relationship between anisotropy error and magnetic field strength for different GMR sensor dimensions.
Figure 9:
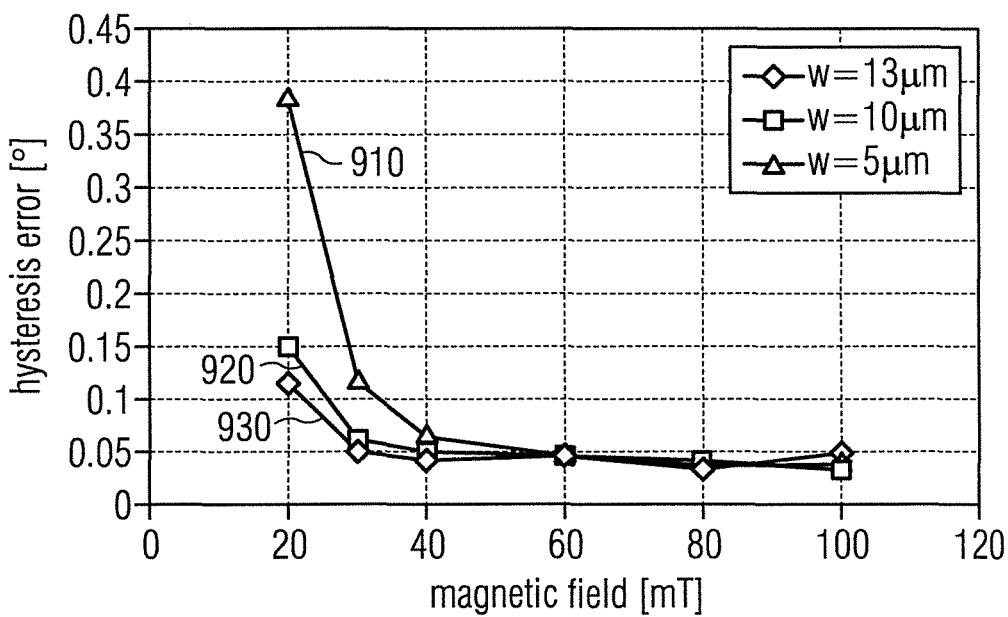
FIG. 9 depicts a diagram showing a relationship between hysteresis error and magnetic field strength for different GMR sensor dimensions.

FIG. 8 shows a relationship between an anisotropy error and a magnetic field strength, and FIG. 9 shows a relationship between a hysteresis error and a magnetic field strength for sensors with respective widths of 13 µm, 10 µm and 5 µm. In FIGS. 8 and 9, the anisotropy error and the hysteresis error, respectively, are plotted in degrees (°) on the y-axis, and the magnetic field strength in Millitesla (mT) is plotted on the x-axis. Graphs 810; 910 connecting triangle-shaped symbols represent measurement values for a GMR sensor of 5 µm in width. Graphs 820; 920 connecting square-shaped symbols represent measurement values for a GMR sensor of 10 µm in width. Graphs 830; 930 connecting diamond-shaped symbols represent measurement values for a GMR sensor of 13 µm in width.

Anisotropy error measurements with exemplary GMR sensors of said different stripe widths in FIG. 8 show that the difference in angular accuracy between two sensor elements having respective widths of 13 µm and 10 µm is between 0.05° and 0.1° for a range of 20 mT to 100 mT. Hysteresis error measurements in FIG. 9 show that the difference in angular accuracy is below 0.05°. Therefore, the angular accuracy of a 10 µm sensor could be acceptable. If a stripe width of the parallel-running second sensor element 712 of 5 µm is chosen, an increase of the anisotropy angular error compared to the first sensor element 711 of roughly 0.1° to 0.3° may be expected according to measurements. Furthermore, at low magnetic fields of <30 mT the hysteresis error is increased by about 0.3° due to the significant higher shape anisotropy of the narrow stripe (see FIG. 9). Nevertheless, the overall angular accuracy of about 0.8° at 20 mT may be good enough to allow a verification of the measured angle by the first sensor element 711 under a variety of circumstances. The first sensor element 711 may hence serve as a resistor comprised by a "master" sensor bridge, and the second sensor element, conversely, may serve as a resistor comprised by an "auxiliary" sensor bridge. The small stripe width of the second sensor element 712 may in some embodiments result in a doubling or tripling of the resistance value of the "original" GMR angle sensor 700, depending on their relative widths. This could for some applications allow a continuous operation of "master" and "auxiliary" at the same time while keeping power consumption low.

Moreover, also other implementations of a "master" sensor with a wide stripe width and an "auxiliary" sensor with a narrow stripe width are possible in further embodiments, like a simple side-by-side configuration of both sensor types. Preferably, resistors with the same reference magnetization direction may be located next to each other. This may enable a magnetization process, for example by laser, for both auxiliary and master sensor structures at the same time.

In some embodiments, the first magneto-resistive sensor element 711 and the second magneto-resistive sensor element 712 are configured to generate the respective signals based on the Giant Magneto-Resistive (GMR) effect. Differences in drift behavior may be mutually checked by the master and auxiliary sensor bridge (for instance temperature-originated offset drifts). GMR sensors are e.g. featured in the embodiments described in FIGS. 7a, 7b, 8 and 9.

Figure 10:
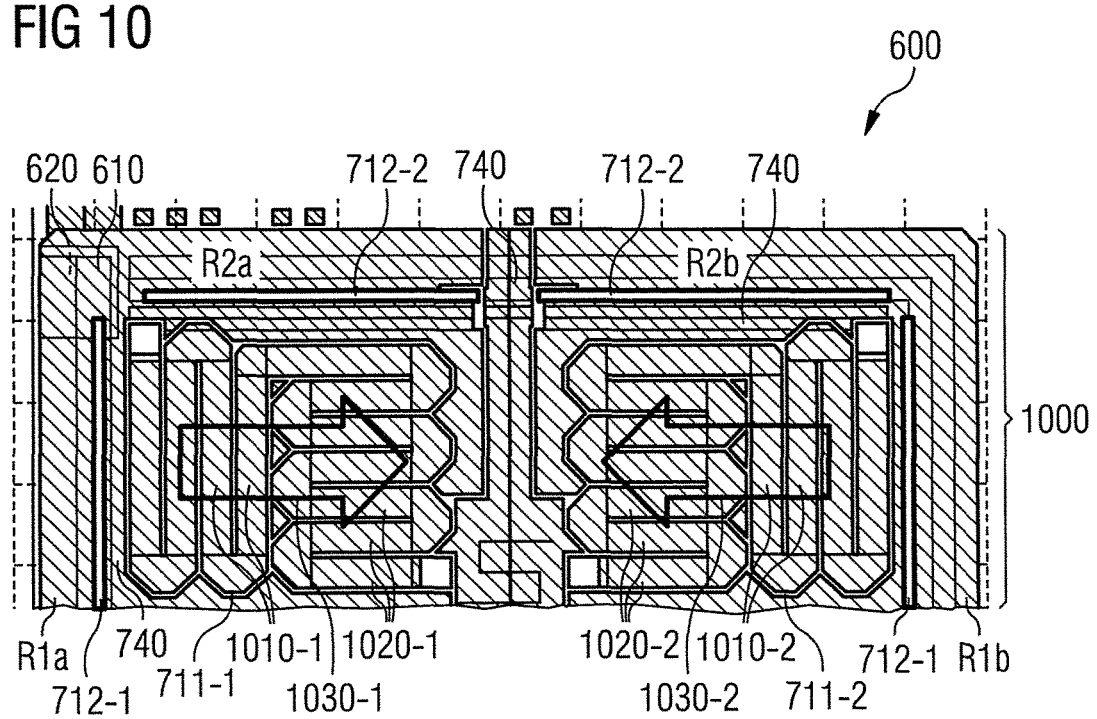
FIG. 10 illustrates an embodiment of monolithically integrated multiple XMR sensors.

A second exemplary approach described here may be referred to as the dual sensor technology approach. A possible embodiment is shown in FIG. 10.

In some embodiments the first magneto-resistive sensor element 711 may be configured to generate the first (electrical) signal based on a first type of magneto-resistive effect. The first magneto-resistive sensor element 711 may also be referred to as master magneto-resistive sensor element 711. The second magneto-resistive sensor element 712 may be configured to generate the second (electrical) signal based on the first or a second type of magneto-resistive effect. The second magneto-resistive sensor element 712 may also be referred to as auxiliary magneto-resistive sensor element 712. In specific, some of these embodiments may feature a first magneto-resistive sensor element 711 configured to generate the first signal based on the Giant Magneto-Resistive (GMR) effect or the Tunnel Magneto-Resistive (TMR) effect, and a second magneto-resistive sensor element 712 configured to generate the second signal based on the Anisotropic Magneto-Resistive (AMR) effect. It is therefore possible in some embodiments, that an AMR sensor may be realized from a structure originally designed to detect a GMR or TMR effect. An idea behind this second approach is to use two different XMR technologies, for example for redundant angle sensing.

Also, systematic drifts like magnetically induced drifts of non-orthogonality or amplitude synchronism may be addressed by this approach. Both technologies may exhibit different kinds of systematic drift mechanisms during lifetime, for example due to a combination of thermal and magnetic (thermo-magnetic) stresses. As a result, a comparison of the output signals of both sensors may be used to check each other regarding plausibility. Systematic technology related drifts as well as statistic drift effects may be mutually checked by this approach. It may therefore represent more than just a redundancy concept and go a step further than the dual sensor structure approach.

In the following, the dual sensor technology approach will be explained on the basis of FIGS. 10, 11a, 11b, 11c, 11d, 12a and 12b.

To give an overview, FIG. 10 displays a general concept of the first and the second sensor element formed on the common substrate and using different XMR technologies. This concept is applied in two exemplary embodiments, visualized in FIGS. 11a-d and in FIGS. 12a-b, respectively.

Figure 11A:
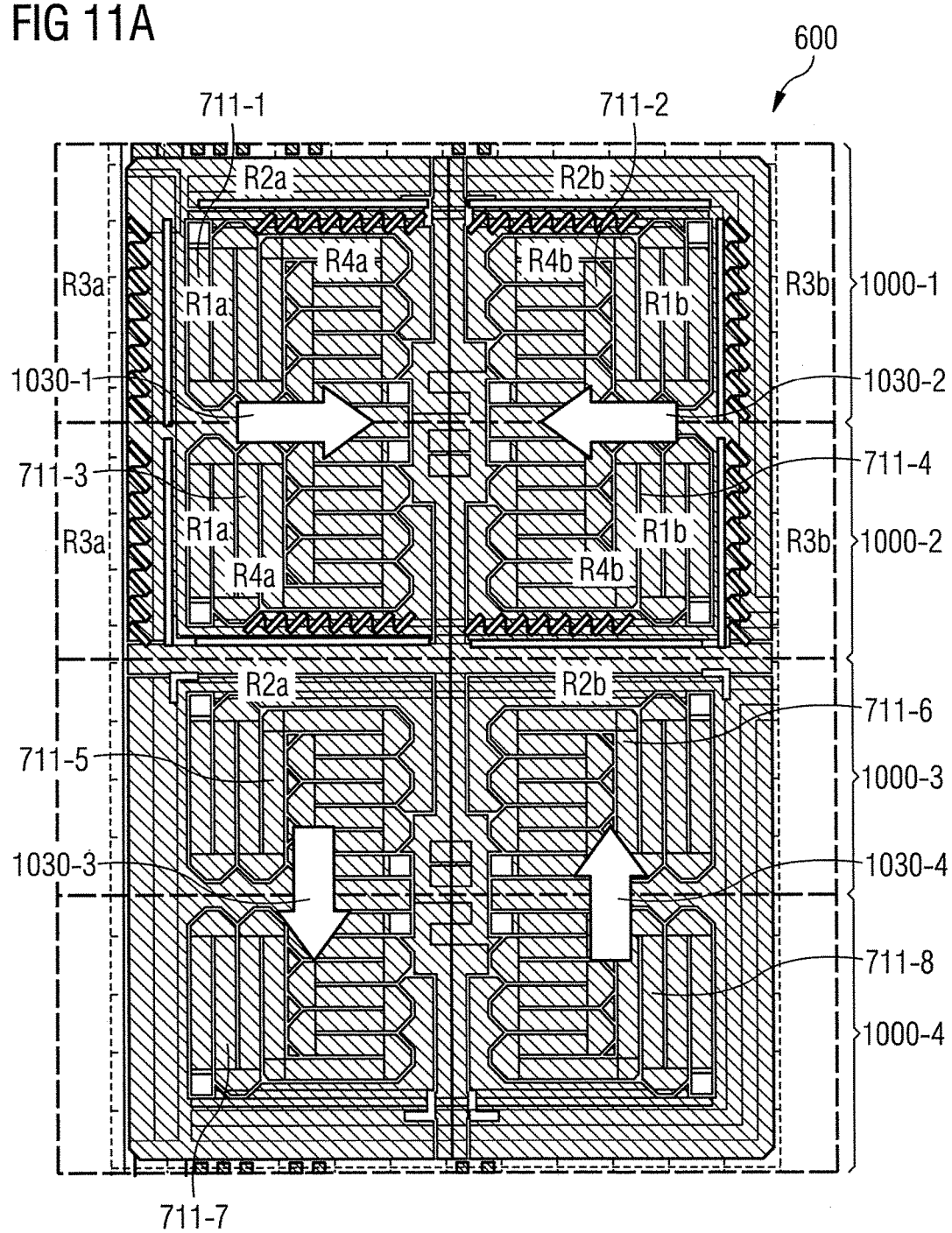
FIG. 11a illustrates an embodiment of a sensor device with monolithically integrated XMR sensors.
Figure 11B:
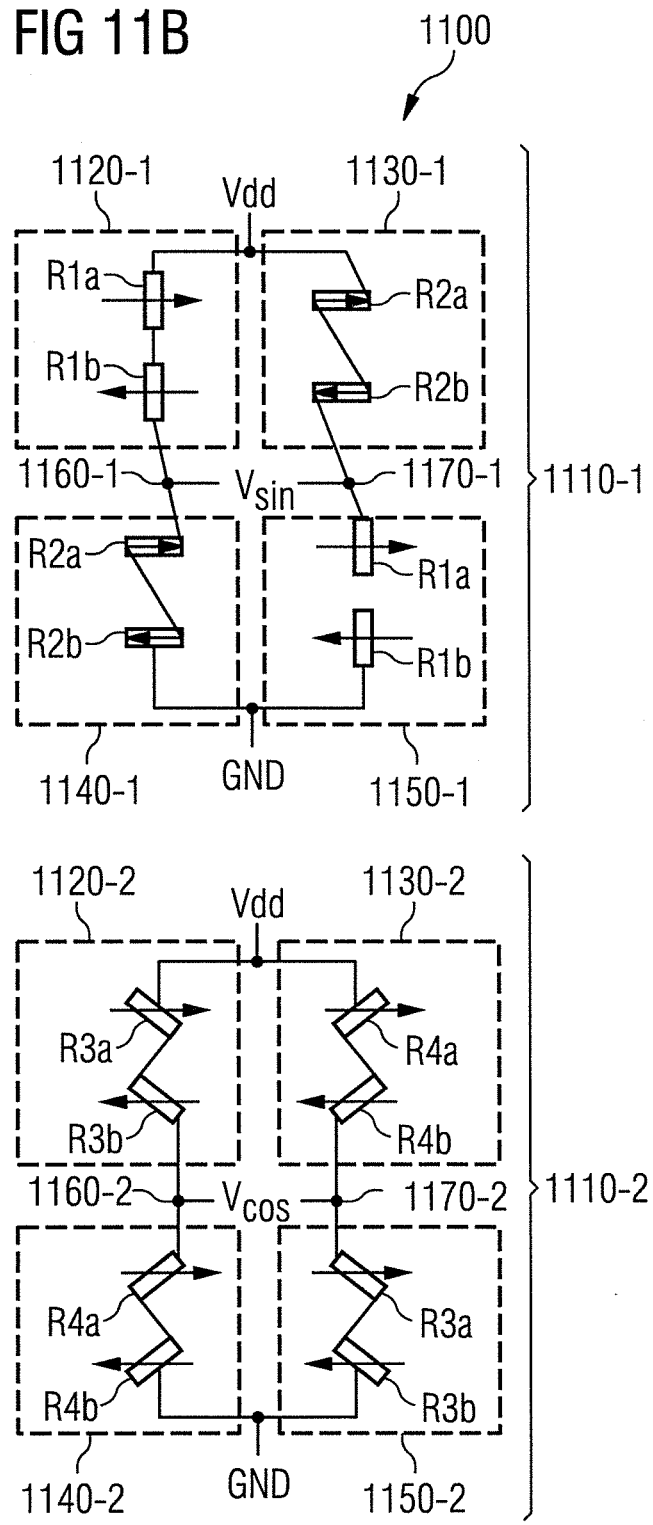
FIG. 11b illustrates a circuit arrangement for AMR sensors comprised by a sensor device.
Figure 11C:
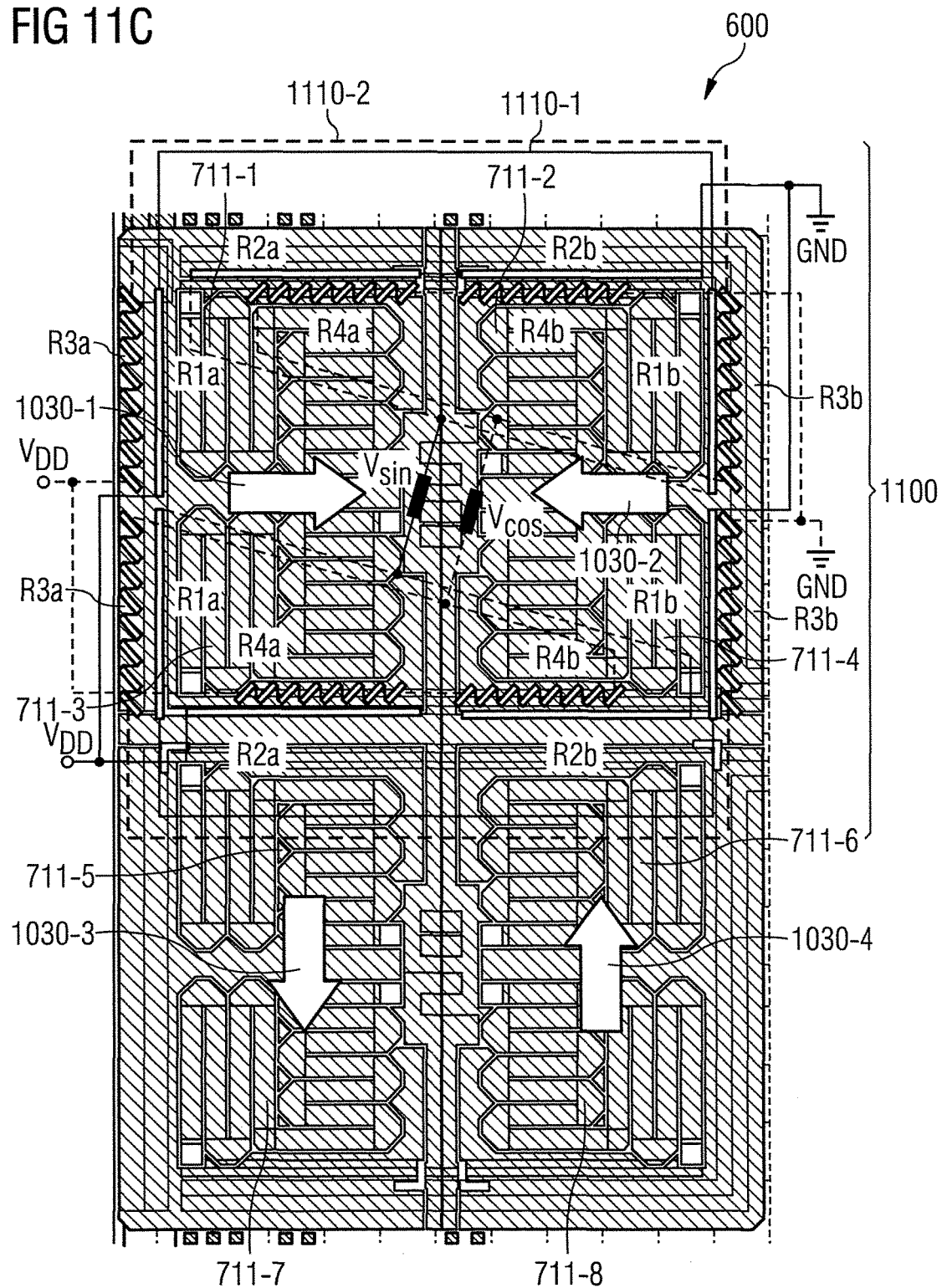
FIG. 11c depicts a schematic view of a circuit arrangement for AMR sensors comprised by a sensor device.
Figure 11D:
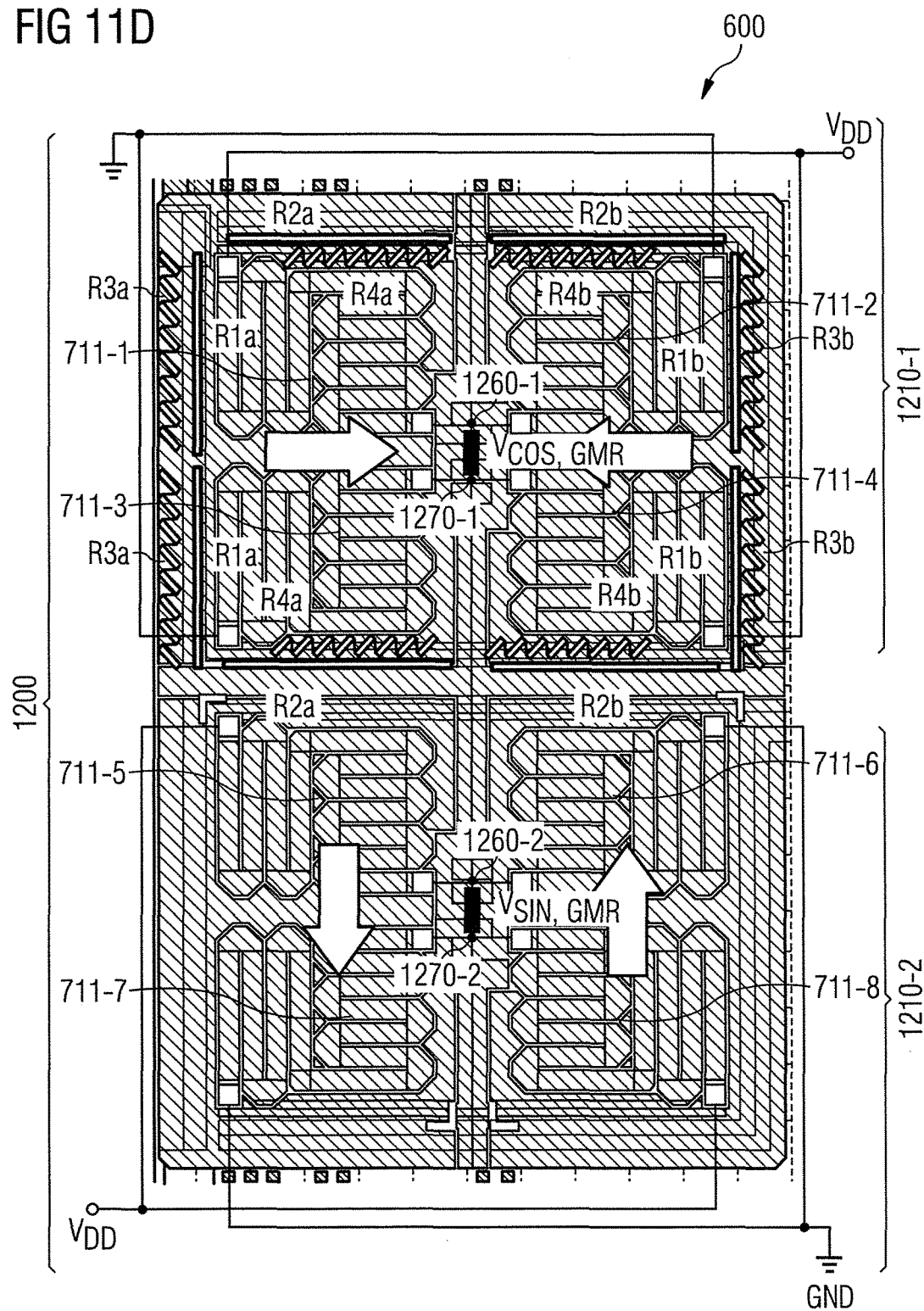
FIG. 11d illustrates a circuit arrangement for GMR sensors comprised by a sensor device.

Referring to the first embodiment, FIG. 11a shows a top view of the sensor device in order to illustrate a possible layout of the sensor device with an exemplary arrangement of the sensor elements. FIG. 11b shows a schematic circuit arrangement of two measurement bridges comprising the second sensor elements shown in FIG. 11a. The two measurement bridges may be combined to a double bridge. FIG. 11c gives an illustrative view of an arrangement of the double bridge within the sensor device presented in FIG. 11a. FIG. 11d finally illustrates two measurement bridges comprising the first sensor elements within the sensor device presented in FIG. 11a.

Figure 12A:
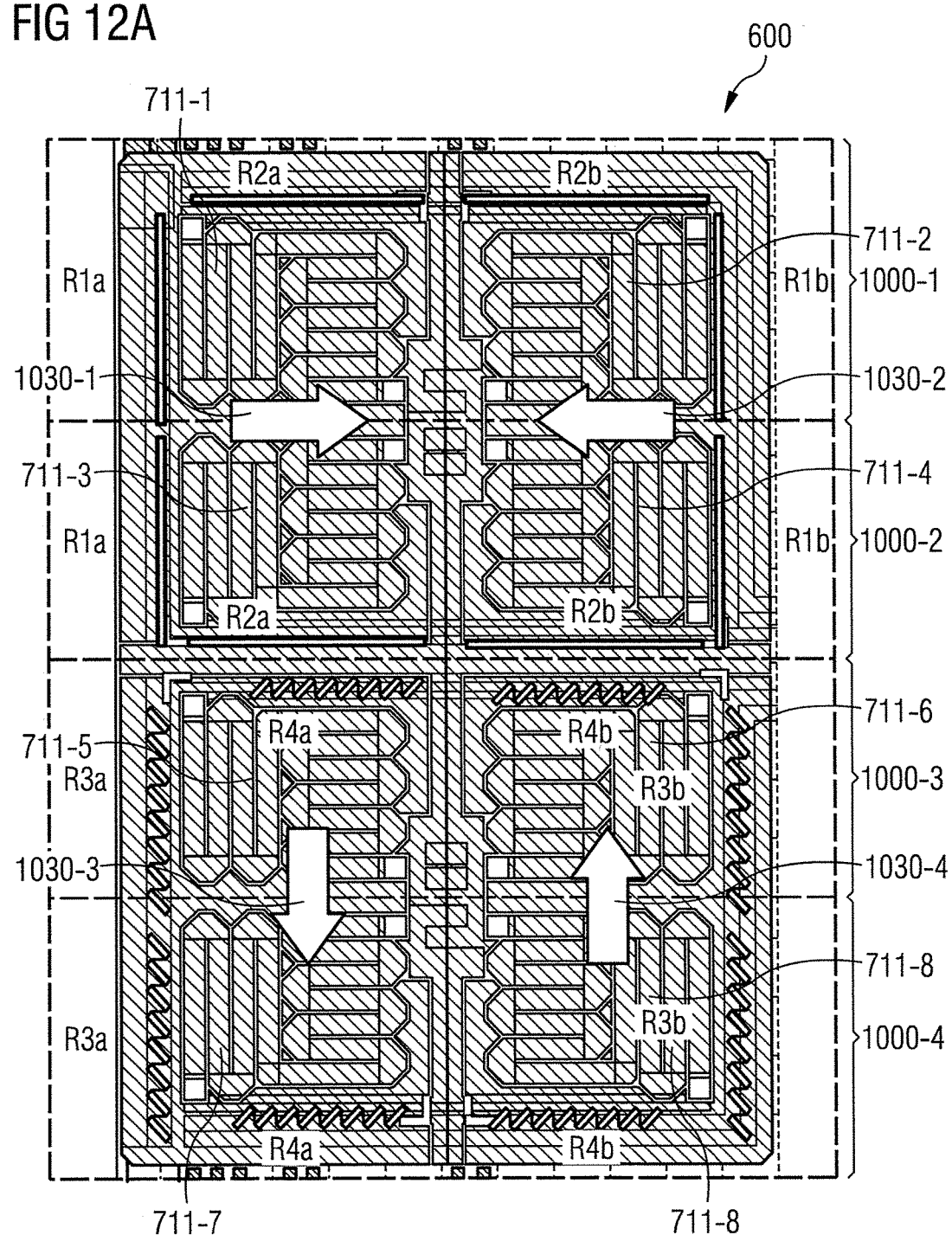
FIG. 12a illustrates another embodiment of two monolithically integrated XMR sensors.

Referring to the second embodiment, FIG. 12a shows another top view of the sensor device in order to illustrate a further possible layout of the sensor device with a further exemplary arrangement of the sensor elements. FIG. 12b shows a schematic circuit arrangement of two measurement bridges comprising the second sensor elements shown in FIG. 12a. The two measurement bridges may be combined to a double bridge.

In FIG. 10 a portion 1000 of a sensor device 600 is shown, comprising a layer stack 610 on a substrate 620. The layer stack 610 therein is viewed from the top or face-on, so the image plane of FIG. 10 is parallel to a layer plane of a layer comprised by the layer stack 610. From a viewer's perspective, the substrate 620 is located behind (or below) the layer stack 610. In the sensor device 600, the first sensor element 711, henceforth referred to as the "master sensor element" may be comprised multiple times; for example FIG. 10 shows a portion 1000 comprising a master sensor element 711-1 with a reference magnetization 1030-1, and a further master sensor element 711-2 with a reference magnetization 1030-2. The master sensor elements 711 are GMR sensor elements configured to generate or cause the first (electrical) signal based on the Giant Magneto-Resistive (GMR) effect. They have a meandered shape. In their structure, the master sensor elements 711-1, 711-2 are essentially identical to the GMR sensor element presented in FIG. 7a. In some embodiments, as is shown in FIG. 10, the master magneto-resistive sensor elements 711 may comprise a first winding 1010 and a second winding 1020 of elongate shape, respectively. The first winding 1010 is arranged perpendicular to the second winding 1020 within a plane of the common substrate 620.

In FIG. 10, second magneto-resistive sensor elements 712-1, 712-2, henceforth denominated as the "auxiliary sensor elements," are comprised twice. The auxiliary sensor elements 712-1; 712-2 are AMR sensor elements configured to generate or cause the second (electrical) signal based on the Anisotropic Magneto-Resistive (AMR) effect. Said AMR effect may for example be measured in a layer corresponding to a free layer in a GMR stack. In some embodiments the second (auxiliary) signal may be of less accuracy than the first (master) signal.

Moreover, in some embodiments, the second (auxiliary) section of the layer stack 610, or the auxiliary sensor element 712-1; 712-2, may comprise a first subsection RXa and a second subsection RXb. A reference magnetization of the first subsection RXa may be opposite to a reference magnetization of the second subsection RXb. The subsections are also referred to as "AMR resistors" in the following; in other words, each AMR resistor is provided by a subsection of an auxiliary section of the layer stack. According to their respective arrangement in FIG. 10, the first subsection (AMR resistor) RXa will be denoted as "left AMR resistor," and the second subsection (AMR resistor) RXb will be denoted as "right AMR resistor" in the following, respectively. This arrangement however is merely an exemplary case and may differ in other embodiments (e.g. front and back instead of left and right). The terms "left" and "right" shall be understood as a means to simplify further explanations.

The auxiliary magneto-resistive sensor element 712-1 is separated by an isolating structure 740 (and by the first magneto-resistive sensor elements 711-1; 711-2) into a left AMR resistor R1a provided by the first subsection and a right AMR resistor R1b provided by the second subsection. Said left R1a and right AMR resistor R1b at least partially frame the master magneto-resistive sensor elements 711-1; 711-2 and have opposite reference magnetizations 1030-1 and 1030-2, respectively. The auxiliary magneto-resistive sensor element 712-2 is separated only by an isolating structure 740 into a left AMR resistor R2a with the reference magnetization 1030-1 and a right AMR resistor R2b with the reference magnetization 1030-2. The AMR resistors R1a; R1b; R2a; R2b are of elongate shape and are each provided by a subsection of the second section of the layer stack 610. In other words, the subsections and hence the AMR resistors of a single auxiliary sensor element 712 may be adjacent to each other, e.g. R2a and R2b, or may not be adjacent to each other, e.g. R1a and R1b. The purposes of the subdivision of AMR sensor elements into two AMR resistors, respectively, will be explained in more detail in the following.

The auxiliary (AMR) sensor element may be comprised even more times, and any additional layer stack sections providing those further AMR sensor elements may also be split up into subsections. Those subsections may be arranged adjacently to the present subsections forming the AMR resistors R1a; R1b; R2a; R2b.

The master and auxiliary sensor elements 711-1; 711-2; 712-1; 712-2 shown in FIG. 10 are all comprised by the common layer stack 610, and may have an equal number of ferromagnetic and non-magnetic layers. The sensor elements 711-1: 711-2; 712-1; 712-2 are separated from each other by an isolating structure 740, which may for example be formed by a groove in the layer stack 610.

FIG. 11a shows an exemplary embodiment of a sensor device 600 comprising four portions 1000-X similar in their structure to the portion 1000 described in FIG. 10. In total, the sensor device 600 shown in FIG. 11a comprises eight master sensor elements 711-X with a meandered shape. Each of the master sensors 711-X is realized as a GMR sensor element. It further comprises eight auxiliary sensor elements, each realized as an AMR sensor element. They are each divided into two AMR resistors labeled "RXa" or "RXb", where X=1; 2; 3; 4. Two AMR resistors labeled with identical second digit and different third digit (e.g. "R2a" and "R2b"), or one left and one right AMR resistor, are part of one common AMR sensor element and have respective reference magnetizations 1030-X opposite to each other. The AMR resistors are further separated from each other by an isolating means.

Each portion 1000 exhibits two master sensor elements 711. Both master sensor elements 711 have a reference magnetization 1030 such that the two reference magnetizations 1030-1 and 1030-2 or 1030-3 and 1030-4 are directed anti-parallel to each other. The reference magnetizations 1030-1; 1030-2 both occur in portions 1000-1 and 1000-2, and are orthogonal to the reference magnetizations 1030-3; 1030-4 both occurring in portions 1000-3 and 1000-4. Portions 1000-1 and 1000-2 each exhibit four AMR sensor elements, and each AMR sensor element is separated into a left AMR resistor R1a; R2a; R3a; R4a and a right AMR resistor R1b; R2b; R3b; R4b In some embodiments the master and the auxiliary magneto-resistive sensor elements share the same reference magnetization. The left AMR resistors R1a; R2a; R3a; R4a thereby share the reference magnetization 1030-1 with the master GMR sensor elements 711-1; 711-3 and are therefore located on the same side of the respective portion. Likewise, the right AMR resistors R1b; R2b; R3b; R4b share the reference magnetization 1030-2 with the master GMR sensor elements 711-2; 711-4 and are located on the opposite side of the respective portion. Portions 1000-3 and 1000-4 however exhibit no AMR sensor elements at all. Each AMR resistor R1a; R2a; R3a; R4a; R1b; R2b; R3b; R4b may by itself generate a signal indicative of the condition of a magnetic field. These signals may be operable to verify the first (master) signal.

Portions 1000-1 and 1000-2 each comprise eight AMR resistors RXa; RXb. AMR resistors R1a; R1b; R3a and R3b are arranged perpendicular to AMR resistors R2a; R2b; R4a and R4b, respectively. AMR resistors R3a; R3b; R4a and R4b are configured to provide a current direction tilted by 45° regarding the current directions of R1a; R1b; R2a; R2b, where the current direction of R1a; R1b is perpendicular to R2a and R2b. This may be achieved by using a horizontally or vertically aligned stripe in combination with so-called "barber poles." Barber poles are commonly used in the AMR technology to achieve a local current direction deviating from the externally applied electric field gradient. Barber poles comprise highly conductive regions which are placed on top or beneath a XMR stack. Alternatively, the 45° orientation of the current may be achieved by introducing alternating stripes of material with different conductivity aligned in a 45° angle to the orientation of the resistor. By this structure, a current direction may be essentially altered by 45°. Hence, the orientation of the external magnetic field may be uniquely determined over an angular range of 180°.

Besides the stripe-like shapes in some embodiments also other shapes may be used, which are suitable for AMR angle sensing like for example circular or non-elongated shapes. Here, the current direction within the single structures may be determined by the position of the contact regions.

FIGS. 11b and 11c each show an embodiment of an auxiliary double bridge circuit arrangement 1100 comprising the AMR resistors RXa; RXb. FIG. 11b shows a schematic circuit diagram, whereas FIG. 11c shows a detailed structural view of the auxiliary double bridge circuit arrangement 1100, which comprises an auxiliary bridge circuit 1110-1 and a further auxiliary bridge circuit 1110-2. As explained initially, a bridge circuit comprising magneto-resistive sensor elements may generate a characteristic signal, for example a voltage, in response to the influence of an external magnetic field on the sensor elements. A further bridge circuit comprising magneto-resistive sensors influenced by said magnetic field may help to identify the orientation of the magnetic field if the signal is ambiguous (for example if the signal has a periodicity of 180°). However, it may also be possible to make use of just one bridge circuit instead of a double bridge circuit arrangement in other embodiments.

FIG. 11d shows an embodiment of a master double bridge circuit arrangement 1200 comprising a master bridge circuit 1210-1 and a further master bridge circuit 1210-2. The master bridge circuit 1210-1 comprises four master GMR resistors 711-1; 711-2; 711-3; 711-4. Correspondingly, the master bridge circuit 1210-2 comprises four master GMR resistors 711-5; 711-6; 711-7; 711-8. The circuit arrangements shown in FIGS. 11b, 11c and 11d apply to the sensor device 600 shown in FIG. 11a. The sensor device 600 may in some embodiments comprise the master bridge circuit 1210-1; 1210-2 and the auxiliary bridge circuit 1110-1; 1110-2.

The master bridge circuit 1210-1; 1210-2 may be configured to provide the first (master) signal and may at least partially comprise the master magneto-resistive sensor element(s) 711. The auxiliary bridge circuit 1110-1, 1110-2 may be configured to provide the second (auxiliary) signal and at least partially comprise the auxiliary magneto-resistive sensor element(s) 712. There may be only one master bridge circuit in some embodiments, or more, as is the case in FIG. 11d, which shows the master bridge circuit 1210-1 and the further master bridge circuit 1210-2. There may, accordingly, be only one master bridge circuit in some embodiments, or more, as is the case in FIGS. 11b and 11c, which show the auxiliary bridge circuit 1110-1 and the further auxiliary bridge circuit 1110-2.

FIGS. 11c and 11d essentially show the same sensor device as FIG. 11a. This means, components in FIGS. 11c and 11d correspond to components of identical appearance in FIG. 11a, which have been described therein. Components shown in FIGS. 11c and 11d and having no identical counterpart in FIG. 11a are further described and explained in the following.

Considering FIGS. 11b and 11c in combination, the bridge circuit 1110-1 has a first serial connection 1120-1 of two AMR resistors R1a and R1b, connected to a supply potential $V_{dd}$ and a first node 1160-1. The first serial connection 1120-1 is connected in parallel to a second serial connection 1130-1 of two AMR resistors R2a and R2b, connected to the supply potential $V_{dd}$ and a second node 1170-1. A third serial connection 1140-1 of two AMR resistors R2a and R2b is connected to the first node 1160-1 and to ground GND. The third serial connection 1140-1 is paralleled to a fourth serial connection 1150-1 of two AMR resistors R1a and R1b, connected to the second node 1170-1 and to ground. Said serial connections may hence comprise a full AMR sensor element each. A voltage $V_{sin}$ may be measured between the first node 1160-1 and the second node 1170-1.

The further bridge circuit 1110-2 has a first serial connection 1120-2 of two AMR resistors R3a and R3b, connected to a supply potential $V_{dd}$ and a first node 1160-2. The first serial connection 1120-2 is paralleled to a second serial connection 1130-2 of two AMR resistors R4a and R4b, connected to the supply potential $V_{dd}$ and a second node 1170-2. A third serial connection 1140-2 of two AMR resistors R4a and R4b is connected to the first node 1160-2 and to ground GND. The third serial connection 1140-2 is paralleled to a fourth serial connection 1150-2 of two AMR resistors R3a and R3b, connected to the second node 1170-2 and to ground. A voltage $V_{cos}$ may be measured between the first node 1160-2 and the second node 1170-2. The AMR sensors comprised by the further bridge circuit 1110-2 are the AMR sensors with the aforementioned barber pole structure.

The voltages $V_{sin}$ and $V_{cos}$ may yield an angle-dependent sine and a cosine signal, respectively. For every angle between 0° and 180° there is one specific combination of a value of $V_{sin}$ and a value of $V_{cos}$, respectively, which may allow a unique determination of an orientation angle of an external magnetic field in a range from 0° to 180°. The aforementioned auxiliary signal may comprise values of $V_{sin}$ or $V_{cos}$, and, with its uniqueness for angles between 0° and 180°, may be suitable for a verification of the master signal. The angle thereby represents an angle between an external magnetic field and a reference direction. The reference direction may be given for example by a reference magnetization or, for instance in the case of a non-magnetized AMR sensor, by a direction of electric current.

In some embodiments the master 1210-1; 1210-2 or auxiliary bridge circuit 1110-1; 1110-2 may comprise a further magneto-resistive sensor element. A reference magnetization 1030-2; 1030-4 of the further magneto-resistive sensor element may thereby be aligned antiparallel to a reference magnetization 1030-1; 1030-3 of the master or auxiliary magneto-resistive sensor element. For example, the serial connections 1120-1; 1130-1; 1140-1; 1150-1; 1120-2; 1130-2; 1140-2; 1150-2 in the circuit arrangement 1100 each comprise two AMR sensors, e.g. the AMR resistor couples (R1a; R1b), (R2a; R2b), (R3a; R3b) and (R4a; R4b), with opposite magnetization directions, respectively. In other words, the AMR resistors RXa; RXb may be regarded as auxiliary sensor elements in their own right. The magnetization may result from a magnetization process which may be conducted to provide the reference magnetization 1030-X for GMR sensors comprised by the sensor device 600. A GMR sensor and an AMR sensor may thus have a pinned layer with the same reference magnetization 1030-X. Hence, a serial connection of two AMR resistors of opposite magnetization may effectively allow for a parasitic GMR effect occurring in the two AMR resistors to cancel out.

In some embodiments a reference magnetization 1030-X of a pinned layer of the first section may differ from a reference magnetization of a pinned layer of the second section. In other words, the master magneto-resistive sensor element 711-1 and the auxiliary magneto-resistive sensor element 712-1 may have different reference magnetizations. In other embodiments, the master (GMR) sensor element 711 may have a reference magnetization 1030-X, while the auxiliary (AMR) sensor element 712 has none at all.

FIG. 11d shows an illustrative layout for a circuit arrangement 1200 comprising the GMR sensors 711-X. The circuit arrangement 1200 comprises a master bridge circuit 1210-1 and a further master bridge circuit 1210-2. Considering FIG. 11d, the master bridge circuit 1210-1 has a GMR resistor 711-1, connected to a supply potential $V_{dd}$ and a first node 1260-1. The GMR resistor 711-1 is paralleled to a GMR resistor 711-4 connected to the supply potential $V_{dd}$ and a second node 1270-1. A GMR resistor 711-2 is connected to the first node 1260-1 and to ground GND. The GMR resistor 711-2 is paralleled to a GMR resistor 711-3 connected to the second node 1270-1 and to ground. A voltage $V_{cos,GMR}$ may be measured between the first node 1260-1 and the second node 1270-1.

The further master bridge circuit 1210-2 has a GMR resistor 711-5, connected to a supply potential $V_{dd}$ and a first node 1260-2. The GMR resistor 711-5 is paralleled to a GMR resistor 711-8 connected to the supply potential $V_{dd}$ and a second node 1270-2. A GMR resistor 711-6 is connected to the first node 1260-2 and to ground GND. The GMR resistor 711-6 is paralleled to a GMR resistor 711-7 connected to the second node 1270-2 and to ground. A voltage $V_{sin,GMK}$ may be measured between the first node 1260-2 and the second node 1270-2.

In some embodiments the master signal and the auxiliary signal may comprise information about an angle between the sensor device and an external magnetic field. The voltages $V_{sin,GMR}$ and $V_{cos,GMK}$ in FIG. 11d may yield an angle-dependent sine and a cosine signal, respectively, when measured over a range from 0° to 360°. Both signals in combination may allow a unique determination of an orientation angle between the external magnetic field and the sensor device (or the reference magnetization) over a range of 360°. More exactly, for a specific angle α there is a correlated value of $V_{cos,GMR}$, which is also correlated to another angle 360°−α. This ambiguity may be solved by regarding the value $V_{sin,GMR}$. The aforementioned master signal may comprise values of $V_{sin,GMK}$ or $V_{cos,GMR}$. Said master signal may be further verified by the auxiliary signal, which may be determined using the circuit arrangement 1100 described in FIGS. 11b and 11c.

In some embodiments the sensor device 600 may further comprise an angle sensor, wherein the angle sensor is configured to verify the master signal by comparison with the auxiliary signal, and at least partially comprises the master 1210-1; 1210-2 and the auxiliary bridge circuit 1110-1; 1110-2. Thus, the GMR sensor elements 711-X may perform the roles of master sensor elements, whereas the AMR sensor elements RXa; RXb may perform the roles of auxiliary sensor elements Explaining FIGS. 11a, 11b, 11c and 11d in other words, some embodiments may be based for example on the usage of a GMR or TMR angle sensor, which may e.g. be designed as a spin valve (SV) type angle sensor. The GMR or TMR angle sensor may act as a high-precision sensor part, whereas the AMR effect of the corresponding free layer (FL) of the layer stack (or the SV stack) may be used to realize a second XMR angle sensor structure. It is possible to use the same layer stack, so only one stack deposition step may be required to provide the layer stack, and only one structuring process for both sensor structures.

To make only the AMR effect measurable while avoiding a "parasitic" GMR or TMR effect, a special bridge configuration may be chosen. FIGS. 11a and 11b show a GMR angle sensor with meander-shaped GMR resistances 711-X (combination of horizontal and vertical meander windings). Two resistances of each Wheatstone full bridge having an identical reference magnetization direction 1030-X (e.g. GMR sensor elements 711-1 of the master bridge circuit 1210-1 and GMR sensor element 711-3 of the master bridge circuit 1210-1) are placed next to each other in order to enable a magnetization of both resistances at the same time for example by laser magnetization process. Each GMR/TMR full bridge 1210-1; 1210-2 exhibits two anti-parallel reference magnetization directions (1030-1 and 1030-2) or (1030-3 and 1030-4), while the reference magnetization axes of both full bridges 1210-1; 1210-2 are orthogonal to each other. As a consequence, when influenced by a rotating external magnetic field, one full bridge 1210-1; 1210-2 may deliver a sine-like output signal, the other full bridge 1210-2; 1210-1 a cosine-like signal.

In order to prevent the AMR sensor structure from delivering a GMR/TMR signal, each AMR active resistor may comprise (at least) two single resistances RXa and RXb with respective anti-parallel magnetizations 1030-X and 1030-Y to obtain a net magnetization of a reference system (the serial connections 1120-1; 1130-1; 1140-1; 1150-1) of essentially zero. As a result, the GMR effect of both resistances may cancel out and a GMR/TMR related resistance modulation may no longer be observed. In another embodiment the resistors RXa; RXb of the AMR sensor may not be magnetized at all. For example, in case no magnetic anisotropies or magnetic fields and strong temperature variations occur during the final XMR processing, a net magnetization of zero of a single AMR resistor RXa; RXb may be possible. Since in some cases there are crystal anisotropies and elevated temperatures present during XMR processing, the approach with a combination of at least two magnetized (e.g. by a laser-magnetization process) resistors forming a single bridge resistor may be a preferred option. The schematic circuitry in FIG. 11b shows that each AMR active resistor (the serial connections 1120-1; 1130-1; 1140-1; 1150-1) of the Wheatstone bridges 1110-1; 1110-2 comprises a series connection of two single resistors RXa; RXb with anti-parallel reference magnetization direction (for instance R1a and R1b). The AMR active resistors are located next to the main GMR or TMR resistors. This may enable a simultaneous laser magnetization process.

Furthermore, a sensor device 600, or just an AMR angle sensor, may have an orthogonal current direction of the single resistors of the Wheatstone bridge. In other words, the Wheatstone bridges 1110-1; 1110-2 in FIG. 11b exhibit at least two AMR resistors with orthogonal current directions. This is considered by horizontal and vertical stripes (for instance R1a and R2a). The further auxiliary AMR active Wheatstone bridge 1110-2 exhibits current directions which are turned by 45° regarding the auxiliary Wheatstone bridge 1110-1 (for instance the current directions for AMR resistors R1a and R3a). In the embodiments of FIGS. 11a and 11b there are only two antiparallel magnetization directions 1030-1 and 1030-2 of the reference system of the AMR active resistors.

In a further embodiment the auxiliary bridge circuit 1110-1 and the further auxiliary bridge circuit 1110-2 may exhibit magnetization axes of the reference system of the AMR active resistors orthogonal to each other. Such an embodiment is shown in FIGS. 12a and 12b.

FIG. 12a shows an embodiment of a sensor device 600 comprising four portions 1000-X essentially identical in their structure to the portion 1000 described in FIG. 10. Also, FIG. 12a shows the same components as FIG. 11a, however, only the AMR resistors R3a, R3b, R4a and R4b are located in a different place. The arrangement is such that each portion 1000-X now comprises two GMR angle sensors 711-X and four AMR resistors RXa; RXb, where the AMR resistors RXa; RXb are aligned as described in FIG. 10 and partially frame the GMR resistors 711-X. The reference magnetization 1030-3 now applies to the AMR resistors R3a and R4a, and the reference magnetization 1030-4 applies to the AMR resistors R3b and R4b. In comparison to FIGS. 11a and 11b, where the left AMR resistors RXa are subject to the reference magnetization 1030-1 and the right AMR resistors RXb are subject to the reference magnetization 1030-2, AMR resistors R3a, R3b and R4a, R4b in FIGS. 12a and 12b now exhibit reference magnetizations 1030-3 and 1030-4 perpendicular to the reference magnetizations 1030-1; 1030-2 affecting the AMR resistors R1a; R1b; R2a; R2b. The functionality and layout of the auxiliary double bridge circuit arrangement 1100, which can be seen in FIG. 12b, remains the same as in FIG. 11b. The further auxiliary bridge circuit 1110-2 comprises the four serial connections 1120-2; 1130-2; 1140-2; 1150-2 comprising two AMR resistors each, with respective antiparallel magnetization directions, in the same arrangement as in FIG. 11b. However, the reference magnetizations of AMR resistors within the same serial connection in FIG. 12b are vertically aligned instead of horizontally, as in FIG. 11b.

A GMR angle sensor stack may exhibit for example a 5 nm thick permalloy free layer (FL) in some embodiments. The AMR effect of the FL may be in the range of at most dR/R~1% in an embodiment, while in combination with the remaining spin valve stack (for example a Cu spacer and a reference system with a PtMn natural anti-ferromagnet) an AMR effect of at most dR/R~0.25% may be expected.

Figure 13:
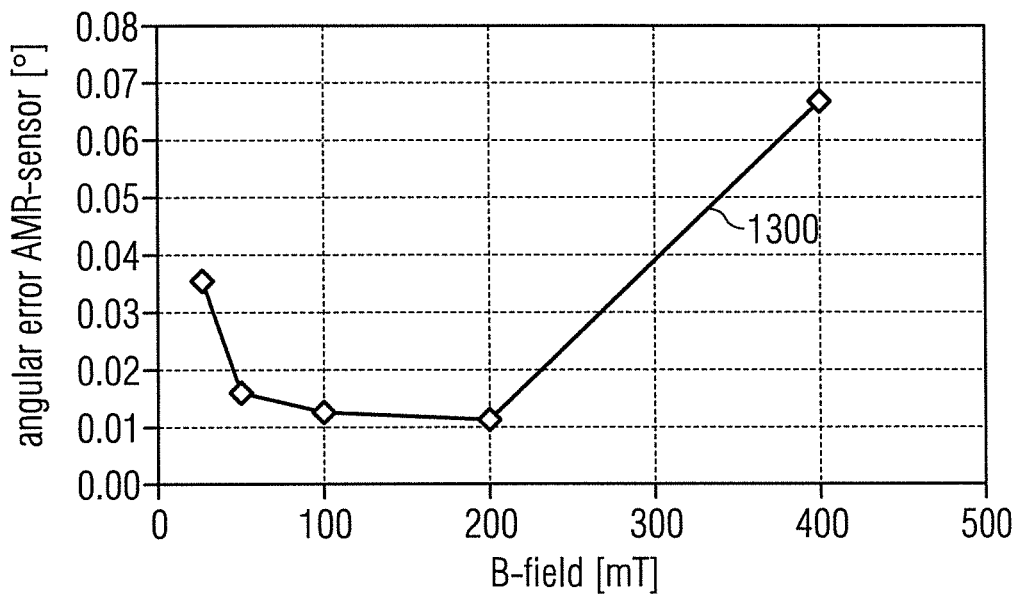
FIG. 13 depicts a diagram showing a relationship between angular error and magnetic field strength for an AMR sensor.

The working principle of the AMR active resistor may be based on the absence of a parasitic GMR/TMR effect. FIG. 13 therefore shows a simulated angular error of the AMR sensor as a function 1300 of strength of a rotating magnetic field according to a Stoner-Wohlfarth model. The input data are extracted from experimental data of a spin-valve GMR stack suitable for high magnetic fields. The strength of the magnetic field in mT is shown on the x-axis, whereas the resulting angular error of the AMR sensor in degrees is shown on the y-axis.

In some embodiments a reference magnetization of a pinned layer of the layer stack may be fixed by a magnetic field, and a magnetization of a free layer of the layer stack may be generated by an external magnetic field. The external magnetic field may thereby exhibit a strength of at most 200 mT. It can be seen from FIG. 13 that for fields <200 mT the angular error continuously decreases with increasing field strength, since the effect of the shape anisotropy on the angular error is reduced. For magnetic fields >200 mT the magnetization of the pinned layer (PL) and reference layer (RL) of the reference system of the SV stack may start moving in the external magnetic field. The application relevant field range may be no higher than 100 mT in some embodiments. As a consequence, the stability of the reference system may be high enough not to disturb the AMR signal of the AMR active GMR/TMR sensor structure for some applications.

Another contribution to a parasitic GMR/TMR effect may arise from a non-ideal anti-parallelism of the reference magnetization directions of a combined AMR active resistor, for example comprising two AMR resistors with ideally opposite magnetizations. Non-ideal anti-parallelism may in some embodiments describe a deviation of two magnetization directions within the same AMR active resistor (serial connection of two AMR resistors) of up to 1°, 5° or 10° from an anti-parallel alignment.

Figure 14:
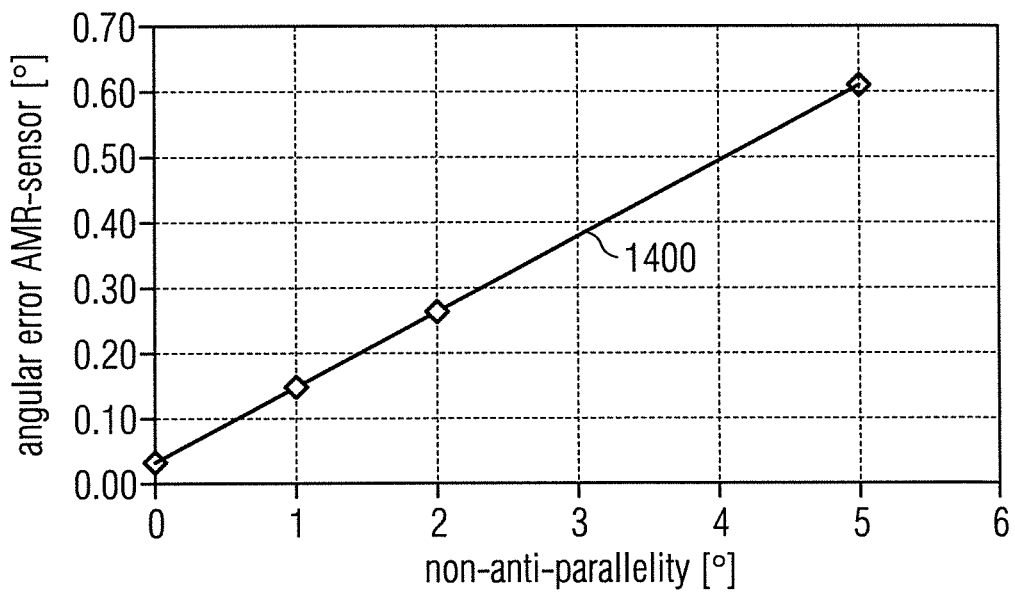
FIG. 14 depicts a diagram showing a relationship between angular error and a deviation from anti-parallelism for an AMR sensor.

FIG. 14 shows the simulated effect of an assumed deviation from an ideal anti-parallelism on the angle error. Deviation from anti-parallelism in degrees is shown on the x-axis, whereas the resulting angular error of the AMR sensor in degrees is shown on the y-axis. A linear behavior of the error function 1400 is observed; some degrees of non-ideal parallelism may result in an angular error of up to several tens of degrees.

Conventional combinations of two sensors based on different technologies (AMR and GMR) may often comprise a multi-package solution, where the two sensors may not be formed on a common substrate. Furthermore, in conventional approaches the AMR sensor may be supposed to be a main sensor and the GMR sensor may act as an auxiliary sensor. According to embodiments this may not be a preferred solution, since the expected AMR signal here may be up to an order of magnitude (or, for instance, up to a factor 10, 15 or 20 in respective embodiments) lower than for an optimum AMR angle sensor. Therefore, the measured angle may not be as accurate.

Summarized in other words, embodiments further relate to a sensor device comprising a master magneto-resistive sensor element for providing a master sensor signal with a first measurement accuracy. The sensor device also comprises an auxiliary magneto-resistive sensor element for providing a verification signal with a second measurement accuracy to verify the master sensor signal. Therein the first measurement accuracy is higher than the second measurement accuracy. The respective accuracies apply under normal operational conditions, or, in other words, under the assumption that the functionality of neither of the sensor elements is compromised for example by occurrence of damage. Embodiments may also be referred to as a dual XMR structure which may for example be used for functional safe angle sensors.

In the embodiments described in FIGS. 11a-12b, the master sensor, e.g. GMR or TMR sensor, exhibits an angle uniqueness of 360°, the auxiliary AMR sensor an angle uniqueness of 180°. The first signal may for example be generated by a GMR or TMR sensor element. The second signal may for example be generated by an AMR sensor element. Nevertheless, the auxiliary AMR sensor result may be suitable to verify the master GMR or TMR sensor result.

Figure 15:
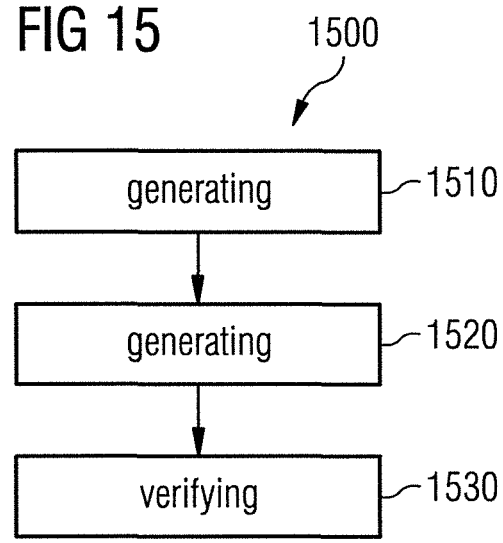
FIG. 15 depicts a flow chart illustrating a method for operating a magneto-resistive sensor according to an embodiment.

Embodiments further provide a method 1500 for operating a magneto-resistive sensor comprising a layer stack comprising ferromagnetic and non-magnetic layers formed on a common substrate, which is shown in FIG. 15. The method 1500 comprises a generating 1510 of a first signal indicative of a condition of a magnetic field by means of a first magneto-resistive sensor element integrated into the layer stack. The method 1500 also comprises a generating 1520 of a second signal indicative of the condition of the magnetic field by means of a second magneto-resistive sensor element integrated into the layer stack. The method 1500 further comprises a verifying 1530 of the first signal by means of the second signal. It may therefore be possible to reduce installation space, production efforts and costs at the same time while keeping safety standards preserved.

Embodiments may increase the functional safety level of XMR sensors, for example XMR angle sensors, by an additional monolithically integrated sensor. A possible approach is to implement an "auxiliary" sensor structure in addition to the "master" sensor based on the identical technology (e.g. GMR). The auxiliary sensor may exhibit a slightly worse angle performance but lower power consumption than the master sensor. Regarding production process, additional effort compared to conventional XMR sensors may not be necessary. Another possible approach is to implement an "auxiliary" sensor structure in addition to the "master" sensor based on a different technology (e.g. AMR). Regarding production process, additional effort compared to conventional XMR sensors may not be necessary. The auxiliary sensor may be used to verify the measurement of the master sensor. Possible applications for embodiments may comprise angle sensors, for instance in steering wheels, throttle, brake, or clutch pedals, rotatable elements in general, or in speed sensors for measuring rotation speed.

The description and drawings merely illustrate some aspects of embodiments. It will thus be appreciated that those skilled in the art will be able to devise various arrangements that, although not explicitly described or shown herein, embody various aspects of embodiments and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Functional blocks shall be understood as functional blocks comprising circuitry that is adapted for performing a certain function, respectively. Hence, a "means or module for s.th." may as well be understood as a "means or module being adapted or suited for s.th.". A means or module being adapted for performing a certain function does, hence, not imply that such means or module necessarily is performing said function (at a given time instant).

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons. Furthermore, in some embodiments a single step may include or may be broken into multiple sub steps. Such sub steps may be included and part of the disclosure of this single step unless explicitly excluded.

The invention claimed is:

1. A device, comprising:
   at least a first magneto-resistive sensor element configured to generate a first signal in response to a magnetic field, wherein the first magneto-resistive sensor element comprises a first section of a common layer stack comprising ferromagnetic and non-magnetic layers formed on a common substrate;
   a second magneto-resistive sensor element configured to generate a second signal in response to the same magnetic field for verifying the first signal, wherein the second magneto-resistive sensor element comprises a second section of the common layer stack,
   wherein the first and the second sections comprise common ferromagnetic and non-magnetic layers of the common layer stack; and
   a verification circuit configured to compare the first signal against the second signal and generate an output signal that indicates whether or not the first signal and the second signal correspond to one another by determining whether a difference between the first and second signal or a ratio between the first and second signal is within a predetermined range.

2. The device according to claim 1, wherein the first magneto-resistive sensor element and the second magneto-resistive sensor element are monolithically integrated on a common die.

3. The device according to claim 1, wherein the first section of the layer stack and the second section of the layer stack are mounted on separate dice.

4. The device according to claim 1, wherein the first and the second section comprise an identical number of ferromagnetic and non-magnetic layers.

5. The device according to claim 1, wherein the first and the second section are separated from each other in the layer stack by an isolating means.

6. The device according to claim 5, wherein the isolating means comprises a separator separating the first section and the second section such that the first and the second section are arranged adjacently on the common substrate in a direction parallel to the common substrate.

7. The device according to claim 1, wherein the first magneto-resistive sensor element differs from the second magneto-resistive sensor element at least in a dimension.

8. The device according to claim 1, wherein a mean value of a width of the second magneto-resistive sensor element corresponds to 40% to 60% of a mean value of a width of the first magneto-resistive sensor element.

9. The device according to claim 1, wherein an accuracy of information of the first or second signal is dependent on a mean value of a width of the corresponding magneto-resistive sensor element or a magneto-resistive effect utilized by the corresponding magneto-resistive sensor element.

10. The device according to claim 1, wherein the first magneto-resistive sensor element is configured to generate the first signal based on the Giant Magneto-Resistive (GMR) effect or the Tunnel Magneto-Resistive (TMR) effect, and the second magneto-resistive sensor element is configured to generate the second signal based on the Anisotropic Magneto-Resistive (AMR) effect.

11. The device according to claim 1, wherein the second section comprises a first and a second subsection, wherein a reference magnetization of the first subsection is opposite to a reference magnetization of the second subsection.

12. The device according to claim 1, wherein the first and the second magneto-resistive sensor elements share the same reference magnetization.

13. The device according to claim 1, wherein a reference magnetization of a pinned layer of the first section differs from a reference magnetization of a pinned layer of the second section.

14. The device according to claim 1, wherein the first signal and the second signal comprise information about an angle between at least one of the magneto-resistive sensor elements and an external magnetic field.

15. A sensor device, comprising:
a layer stack comprising at least ferromagnetic and non-magnetic layers formed on a common substrate;
at least a first magneto-resistive sensor element provided by a first section of the layer stack, wherein the first magneto-resistive sensor element is configured to generate a first signal;
a second magneto-resistive sensor element provided by a second section of the layer stack, wherein the second magneto-resistive sensor element is configured to generate a second signal for verifying the first signal;
a first bridge circuit, wherein the first bridge circuit is configured to provide the first signal and at least partially comprises the first magneto-resistive sensor element, and
a second bridge circuit, wherein the second bridge circuit is configured to provide the second signal and at least partially comprises the second magneto-resistive sensor element,
wherein the first or second bridge circuit comprises a further magneto-resistive sensor element, wherein a reference magnetization of the further magneto-resistive sensor element is aligned antiparallel to a reference magnetization of the first or second magneto-resistive sensor element.

16. A device, comprising:
a master magneto-resistive sensor element for providing a master sensor signal with a first measurement accuracy;
an auxiliary magneto-resistive sensor element for providing a verification signal with a second measurement accuracy to verify the master sensor signal,
wherein the first measurement accuracy is higher than the second measurement accuracy,
wherein the master and auxiliary magneto-resistive sensor element both comprise common ferromagnetic and non-magnetic layers from a common layer stack; and
a verification circuit configured to compare the master sensor signal against the verification signal and generate an output signal that indicates whether or not the master sensor signal and the verification signal correspond to one another by determining whether a difference between the master sensor signal and the verification signal or a ratio between the master sensor signal and the verification signal is within a predetermined range.

* * * * *